(12) United States Patent
Leem et al.

(10) Patent No.: US 11,777,048 B2
(45) Date of Patent: Oct. 3, 2023

(54) SENSORS AND ELECTRONIC DEVICES

(71) Applicant: Samsung Electronics Co., Ltd., Suwon-si (KR)

(72) Inventors: Dong-Seok Leem, Seongnam-si (KR); Rae Sung Kim, Hwaseong-si (KR); In Sun Park, Suwon-si (KR); Ohkyu Kwon, Seoul (KR); Changki Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 204 days.

(21) Appl. No.: 17/236,439

(22) Filed: Apr. 21, 2021

(65) Prior Publication Data
US 2021/0343891 A1    Nov. 4, 2021

(30) Foreign Application Priority Data
Apr. 29, 2020 (KR) ........................ 10-2020-0052147

(51) Int. Cl.
*H01L 31/101*    (2006.01)
*H01L 31/0232*    (2014.01)

(52) U.S. Cl.
CPC .... *H01L 31/1013* (2013.01); *H01L 31/02327* (2013.01)

(58) Field of Classification Search
CPC ........... H01L 31/1013; H01L 31/02327; H01L 51/4253; H01L 31/022408; H01L 31/109;
(Continued)

(56) References Cited

U.S. PATENT DOCUMENTS 9,444,062 B2    9/2016  Becker et al.
9,812,491 B2    11/2017 Tamaki et al.
(Continued)

FOREIGN PATENT DOCUMENTS

EP    2385556 A1    11/2011
EP    03520150 A1    8/2019
(Continued)

OTHER PUBLICATIONS

Extended European Search Report dated Oct. 5, 2021 for corresponding European Application No. 21169676.0.

*Primary Examiner* — Bitew A Dinke
(74) *Attorney, Agent, or Firm* — Harness, Dickey & Pierce, P.L.C.

(57) ABSTRACT

A sensor includes a first electrode, a second electrode facing the first electrode, and a light absorbing layer between the first electrode and the second electrode. The light absorbing layer may have a first absorption spectrum having a first absorption peak in a first infrared wavelength region and a second absorption peak in a second infrared wavelength region, the second infrared wavelength region being a longer wavelength region than the first infrared wavelength region. The second absorption spectrum does not at least partially overlap with the first absorption spectrum. The second absorption spectrum may have a lower absorption intensity than the first absorption spectrum. An external quantum efficiency (EQE) spectrum that is amplified in the second infrared wavelength region is exhibited in the sensor.

39 Claims, 33 Drawing Sheets

(58) Field of Classification Search
CPC ......... Y02E 10/549; G01J 3/42; G01N 21/27; G01N 21/359
See application file for complete search history.

(56) References Cited

U.S. PATENT DOCUMENTS

| | | | |
|---|---|---|---|
| 10,381,413 B2 | 8/2019 | Yun et al. | |
| 11,004,909 B2* | 5/2021 | Lee | H01L 27/3209 |
| 11,133,352 B2* | 9/2021 | Park | H01L 27/302 |
| 11,158,676 B2* | 10/2021 | Leem | H01L 51/4253 |
| 2009/0179291 A1 | 7/2009 | Nam | H01L 27/14647 257/E31.015 |
| 2012/0056192 A1* | 3/2012 | Nam | H01L 27/14647 257/E31.027 |
| 2014/0070189 A1* | 3/2014 | Leem | H01L 51/5215 257/40 |
| 2014/0239271 A1* | 8/2014 | Leem | H01L 51/4253 257/432 |
| 2014/0239278 A1* | 8/2014 | Park | H01L 27/307 257/40 |
| 2015/0287945 A1 | 10/2015 | Forrest | |
| 2015/0287946 A1* | 10/2015 | Leem | C09B 47/04 257/40 |
| 2016/0020258 A1* | 1/2016 | Park | H01L 27/302 257/40 |
| 2016/0197122 A1* | 7/2016 | Ryuichi | H01L 51/107 257/40 |
| 2016/0211465 A1* | 7/2016 | Tadao | H01L 27/307 |
| 2016/0301013 A1* | 10/2016 | Rie | H01L 51/0053 |
| 2017/0148994 A1* | 5/2017 | Choi | H01L 51/525 |
| 2017/0213973 A1* | 7/2017 | Yun | H01L 51/0061 |
| 2018/0062112 A1* | 3/2018 | Heo | H01L 51/0062 |
| 2018/0138330 A1 | 5/2018 | Choi | |
| 2018/0198005 A1 | 7/2018 | Siegmund et al. | |
| 2018/0366658 A1* | 12/2018 | Barr | H10K 85/657 |
| 2018/0366667 A1 | 12/2018 | Barr et al. | |
| 2018/0366668 A1* | 12/2018 | Barr | H10K 85/654 |
| 2019/0074327 A1* | 3/2019 | Yun | H01L 31/14 |
| 2019/0079228 A1* | 3/2019 | Kim | G02B 5/208 |
| 2019/0120689 A1* | 4/2019 | Leem | H01L 27/14669 |
| 2019/0173032 A1* | 6/2019 | Park | H01L 51/0071 |
| 2019/0214591 A1* | 7/2019 | Park | H01L 27/307 |
| 2019/0363269 A1* | 11/2019 | Leem | H01L 27/307 |
| 2020/0031849 A1* | 1/2020 | Kim | C07F 9/11 |
| 2020/0111980 A1* | 4/2020 | Zhu | H01L 51/4246 |
| 2020/0136063 A1* | 4/2020 | Kwon | H01L 51/0071 |
| 2020/0388778 A1* | 12/2020 | Bulovic | H10K 30/10 |
| 2021/0050538 A1* | 2/2021 | Pandey | H10K 30/30 |
| 2021/0050539 A1* | 2/2021 | Barr | H10K 30/30 |
| 2021/0050540 A1* | 2/2021 | Barr | H10K 30/82 |
| 2021/0242417 A1* | 8/2021 | Sykes | H10K 30/30 |
| 2021/0273180 A1* | 9/2021 | Park | H01L 51/0072 |
| 2021/0305522 A1* | 9/2021 | Ferrara | H01L 27/30 |
| 2021/0351314 A1* | 11/2021 | Park | H01L 31/1121 |

FOREIGN PATENT DOCUMENTS

| | | |
|---|---|---|
| JP | 2670289 B2 | 10/1997 |
| JP | 2016-225456 A | 12/2016 |
| KR | 2015-0066587 A | 6/2015 |
| KR | 10-1722277 B1 | 3/2017 |
| KR | 2019-0026451 A | 3/2019 |
| WO | WO-2016/202995 A1 | 12/2016 |
| WO | WO-2018/060672 A1 | 4/2018 |

* cited by examiner

SENSORS AND ELECTRONIC DEVICES

CROSS-REFERENCE TO RELATED APPLICATION

This application claims priority to and the benefit of Korean Patent Application No. 10-2020-0052147 filed in the Korean Intellectual Property Office on Apr. 29, 2020, the entire contents of which are incorporated herein by reference.

BACKGROUND

1. Field

Sensors and electronic devices are disclosed.

2. Description of the Related Art

In recent years, infrared sensors configured to detect light in infra-red wavelength spectrum have been researched to improve sensitivity of the sensors in low-illumination environments or for use as a biometric or authentication device. Silicon photodiodes may be used as infrared sensors. However, although silicon is configured to absorb light in a near-infrared wavelength spectrum of less than about 1000 nm from a visible wavelength spectrum, there is a limit in absorbing light in the near-infrared wavelength spectrum of greater than or equal to about 1000 nm.

SUMMARY

Some example embodiments provide one or more sensors that may be effectively used to sense light in an infrared wavelength spectrum of greater than or equal to about 1000 nm.

Some example embodiments provide one or more electronic devices including the one or more sensors.

According to some example embodiments, a sensor may include a first electrode including a reflective layer, a second electrode facing the first electrode, and a light absorbing layer between the first electrode and the second electrode. The light absorbing layer may have a first absorption spectrum having a first absorption peak in a first infrared wavelength region and a second absorption spectrum having a second absorption peak in a second infrared wavelength region. The second absorption spectrum may not at least partially overlap with the first absorption spectrum. The second infrared wavelength region may be a region having a longer wavelength than that of the first infrared wavelength region. The second absorption spectrum may have a lower absorption intensity than the first absorption spectrum. An external quantum efficiency (EQE) spectrum in the second infrared wavelength region may be amplified, such that a variance of a local maximum EQE value ($EQE_{max}$) of the EQE spectrum from a remainder of EQE values of the EQE spectrum in the second infrared wavelength region is greater than a variance of the second absorption peak from a remainder of absorption intensities of the second absorption spectrum in the second infrared wavelength region, and/or a full width at half maximum (FWHM) of the EQE spectrum in the second infrared wavelength region is narrower than a full width at half maximum (FWHM) of the second absorption spectrum in the second infrared wavelength region.

A difference between a wavelength at the second absorption peak of the second absorption spectrum and a wavelength at the first absorption peak of the first absorption spectrum may be greater than or equal to about 100 nm.

The wavelength at the first absorption peak of the first absorption spectrum may be within with a range of about 700 nm to about 1000 nm. The wavelength at the second absorption peak of the second absorption spectrum may be within a separate range of about 1000 nm to about 3000 nm.

A first absorption intensity at the first absorption peak of the first absorption spectrum and a second absorption intensity at the second absorption peak of the second absorption spectrum may satisfy Relationship Equation 1:

$$0.1 \leq Abs_2/Abs_1 \leq 0.8 \quad \text{[Relationship Equation 1]}$$

wherein, in Relationship Equation 1,
$Abs_1$ is the first absorption intensity at the first absorption peak of the first absorption spectrum, and
$Abs_2$ is the second absorption intensity at the second absorption peak of the second absorption spectrum.

The FWHM of the EQE spectrum in the second infrared wavelength region may be narrower than a FWHM of the EQE spectrum in the first infrared wavelength region.

The FWHM of the EQE spectrum in the second infrared wavelength region may be within a range of about 10 nm to about 200 nm.

The local maximum EQE value may be greater than or equal to about 4%.

The sensor may further include a buffer layer between the first electrode and the light absorbing layer or between the second electrode and the light absorbing layer.

A peak wavelength of the EQE spectrum in the second infrared wavelength region may be at least partially defined by a distance between the reflective layer and the second electrode, and the distance between the reflective layer and the second electrode may be at least partially defined by at least one of a thickness of the light absorbing layer or a thickness of the buffer layer.

As the distance between the reflective layer and the second electrode increases, the peak wavelength of the EQE spectrum in the second infrared wavelength region may be shifted to a longer wavelength region, such that a wavelength magnitude of the peak wavelength of the EQE spectrum in the second infrared wavelength region is proportional to the distance between the reflective layer and the second electrode.

As the thickness of the light absorbing layer increases, the peak wavelength of the EQE spectrum in the second infrared wavelength region may be shifted to a longer wavelength region, such that a wavelength magnitude of the peak wavelength of the EQE spectrum in the second infrared wavelength region is proportional to the thickness of the light absorbing layer.

As the thickness of the buffer layer increases, the peak wavelength of the EQE spectrum in the second infrared wavelength region may be shifted to a longer wavelength region, such that a wavelength magnitude of the peak wavelength of the EQE spectrum in the second infrared wavelength region is proportional to the thickness of the buffer layer.

The light absorbing layer may include a near-infrared absorbing material, and a counter material defining a pn junction with the near-infrared absorbing material. The near-infrared absorbing material may be configured to absorb light in both the first absorption spectrum and the second absorption spectrum. A peak wavelength of the EQE spectrum in the second infrared wavelength region may be at least partially defined by a composition ratio of the near-infrared absorbing material and the counter material in the light absorbing layer.

As the composition ratio of the near-infrared absorbing material relative to the counter material is higher, the peak wavelength of the EQE spectrum in the second infrared wavelength region may be shifted to a longer wavelength region, such that a magnitude of the peak wavelength of the EQE spectrum in the second infrared wavelength region is proportional to the composition ratio of the near-infrared absorbing material relative to the counter material.

The reflective layer may include Ag, Cu, Al, Au, Ti, Cr, Ni, an alloy thereof, a nitride thereof, or any combination thereof.

The second electrode may include a semi-transmissive layer.

The first electrode and the second electrode may be configured to collectively define a microcavity in the sensor, and a peak wavelength of the external quantum efficiency (EQE) spectrum in the second infrared wavelength region may be at least partially defined by a resonance wavelength of the microcavity.

The sensor may further include an optical auxiliary layer on the second electrode, wherein the second electrode includes a light-transmitting layer, a semi-transmissive layer, or any combination thereof.

The optical auxiliary layer may include a first optical auxiliary layer and a second optical auxiliary layer, the first optical auxiliary layer and the second optical auxiliary layer having different refractive indexes.

The first electrode and the second electrode, or the first electrode and the optical auxiliary layer, may collectively define a microcavity, and a peak wavelength of the EQE spectrum in the second infrared wavelength region may be at least partially defined by a resonance wavelength of the microcavity.

The second electrode may include an inorganic nano-layer facing the light absorbing layer such that the inorganic nano-layer is proximate to the light absorbing layer in relation to a surface of the second electrode that is distal from the light absorbing layer, and the inorganic nano-layer may include ytterbium (Yb), calcium (Ca), potassium (K), barium (Ba), magnesium (Mg), lithium fluoride (LiF), or an alloy thereof.

The sensor may further include a semiconductor substrate, the semiconductor substrate being under the first electrode.

An electronic device may include the sensor.

According to some example embodiments, a sensor may include a first electrode and a second electrode facing each other, and a light absorbing layer between the first electrode and the second electrode. A maximum absorption wavelength of an absorption spectrum of the sensor may be within a range of about 800 nm to about 990 nm. The sensor may be configured to generate an electrical current based on photoelectrically converting incident light in a wavelength region of greater than or equal to about 1100 nm.

A peak wavelength of the external quantum efficiency (EQE) spectrum of the sensor may be within a range of about 1100 nm to about 1800 nm, and a full width at half maximum (FWHM) of an external quantum efficiency (EQE) spectrum of the sensor may be within a range of about 10 nm to about 200 nm.

A maximum value of an external quantum efficiency ($EQE_{max}$) in the wavelength region of greater than or equal to about 1100 nm of the sensor may be greater than or equal to about 4%.

The sensor may further include a buffer layer between the first electrode and the light absorbing layer or between the second electrode and the light absorbing layer.

The first electrode may include a reflective layer, and a peak wavelength of an external quantum efficiency (EQE) spectrum of the sensor may be at least partially defined by at least one of a thickness of the light absorbing layer or a thickness of the buffer layer.

The sensor may further include a semiconductor substrate, the semiconductor substrate being under the first electrode.

An electronic device may include the sensor.

According to some example embodiments, a sensor may include a first electrode and a second electrode facing each other, and a light absorbing layer between the first electrode and the second electrode. A maximum absorption wavelength of the light absorbing layer may be within a range of about 700 nm to about 1000 nm. An external quantum efficiency (EQE) spectrum of the sensor may have a local maximum EQE value at a local peak wavelength that is greater than about 1000 nm, such that EQE values of the EQE spectrum of the sensor at all wavelengths up to 100 nm shorter than the local peak wavelength are smaller than the local maximum EQE value, and EQE values of the EQE spectrum of the sensor at all wavelengths up to 100 nm longer than the local peak wavelength are smaller than the local maximum EQE value.

The local maximum EQE value of the EQE spectrum of the sensor may be greater than or equal to about 4%.

The sensor may further include a buffer layer between the first electrode and the light absorbing layer or between the second electrode and the light absorbing layer.

The first electrode may include a reflective layer, and the local peak wavelength may be at least partially defined by at least one of a thickness of the light absorbing layer or a thickness of the buffer layer.

The sensor may further include an optical auxiliary layer on the second electrode. The second electrode may include a light-transmitting layer, a semi-transmissive layer, or any combination thereof.

The optical auxiliary layer may include a first optical auxiliary layer and a second optical auxiliary layer, the first optical auxiliary layer and the second optical auxiliary layer having different refractive indexes.

The first electrode and the second electrode, or the first electrode and the optical auxiliary layer, may collectively define a microcavity, and the local peak wavelength may be at least partially defined by a resonance wavelength of the microcavity.

An electronic device may include the sensor.

Light of an infrared wavelength spectrum of greater than or equal to about 1000 nm or greater than or equal to about 1100 nm may be effectively sensed by the sensor, thereby providing improved light sensing performance by the sensor.

DETAILED DESCRIPTION

Figure 1:
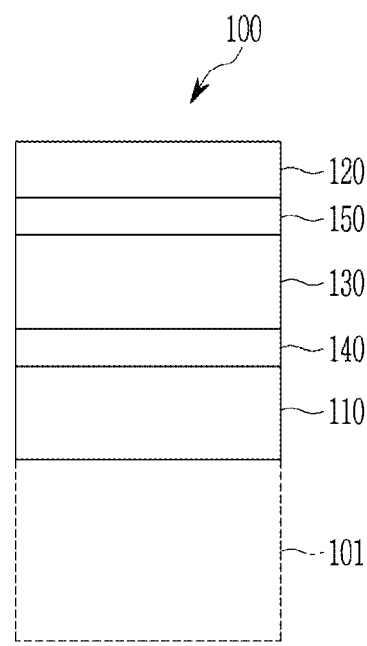
FIG. 1 is a cross-sectional view showing an example of an infrared sensor according to some example embodiments.

Hereinafter, example embodiments will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present such that the element and the other element are isolated from direct contact with each other by one or more interposing spaces and/or structures. In contrast, when an element is referred to as being "directly on" another element, there are no intervening elements present such that the element and the other element are in direct contact with each other. As described herein, an element that is "on" another element may be above, beneath, and/or horizontally adjacent to the other element.

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as with increments of 0.1%.

Hereinafter, a sensor according to some example embodiments is described.

A sensor according to some example embodiments (hereinafter, referred to as an "infrared sensor") is configured to sense light in an infrared wavelength region. The infrared sensor is configured to sense light in at least a portion of the infrared wavelength region. The infrared wavelength region may, for example, belong to a wavelength region (also referred to herein interchangeably as being within a wavelength region) of greater than about 700 nm and less than or equal to 3000 nm, for example from about 750 nm to about 3000 nm, about 750 nm to about 2000 nm, or about 750 nm to about 1800 nm. A "wavelength region" as described herein may be interchangeably referred to as a "wavelength spectrum."

Figure 2:
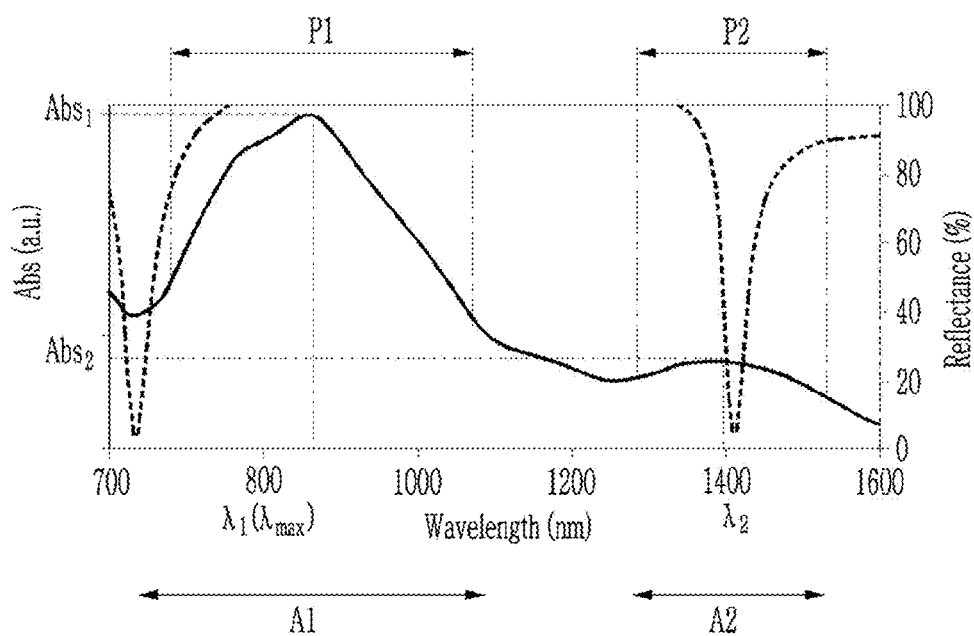
FIG. 2 is an optical spectrum of an example of the infrared sensor of FIG. 1, according to some example embodiments.

FIG. 1 is a cross-sectional view showing an example of an infrared sensor according to some example embodiments, and FIG. 2 is an optical spectrum of an example of the infrared sensor of FIG. 1.

Referring to FIG. 1, an infrared sensor 100 according to some example embodiments includes a first electrode 110, a second electrode 120, a light absorbing layer 130 between the first electrode 110 and the second electrode 120, and buffer layers 140 and 150. It will be understood that in some example embodiments one or both of the buffer layers 140 and 150 may be omitted from infrared sensor 100.

A substrate 101 may be disposed under the first electrode 110 or may be disposed on (e.g., above) the second electrode 120. For example, the substrate 101 may be disposed under the first electrode 110. The substrate 101 may include, for example, a semiconductor substrate such as silicon substrate; a glass substrate; or a polymer substrate such as polycarbonate, polymethylmethacrylate, polyethyleneterephthalate, polyethylenenaphthalate, polyamide, polyethersulfone, or any combination thereof, but is not limited thereto. The substrate 101 may be omitted from infrared sensor 100.

One of the first electrode 110 and the second electrode 120 is an anode, and the other is a cathode. For example, the first electrode 110 may be an anode and the second electrode 120 may be a cathode. For example, the first electrode 110 may be a cathode and the second electrode 120 may be an anode.

The first electrode 110 may be a reflective electrode including a reflective layer.

For example, the first electrode 110 may be formed of (e.g., may at least partially or completely comprise) a reflective layer including an optically opaque material. The reflective layer may, for example, have a light transmittance of less than about 10%, for example, a light transmittance of less than or equal to about 8%, less than or equal to about 7%, less than or equal to about 5%, less than or equal to about 3%, or less than or equal to about 1%. The light transmittance of the reflective layer may, in addition to being equal to or less than at least one of the aforementioned transmittance values, be greater than or equal to 0%, for example greater than or equal to about 0.1%, greater than or equal to about 0.5%, greater than or equal to about 0.9%, greater than or equal to about 1%, greater than or equal to about 2%, greater than or equal to about 3%, greater than or equal to about 5%, greater than or equal to about 7%, or greater than or equal to about 8%. The reflective layer may have (e.g., may include), for example, a reflectance of greater than or equal to about 10%, for example, greater than or equal to about 20%, greater than or equal to about 30%, greater than or equal to about 50%, or greater than or equal to about 70%. The reflectance of the reflective layer may, in addition to being greater than or equal to at least one of the aforementioned reflectance values, be equal to or less than 100%, equal to or less than about 99%, equal to or less than about 90%, equal to or less than about 80%, equal to or less than about 75%, equal to or less than about 70%, equal to or less than about 50%, or equal to or less than about 30%. The optically opaque material may include a metal, a metal nitride, or any combination thereof, for example silver (Ag), copper (Cu), aluminum (Al), gold (Au), titanium (Ti), chromium (Cr), Nickel (Ni), an alloy thereof, a nitride thereof (e.g., TiN), or any combination thereof, but is not limited thereto. The reflective layer may be one layer or two or more layers.

For example, the first electrode 110 may include a reflective layer including an optically opaque material and a light-transmitting layer including an optically transparent material. The reflective layer is as described above. The light-transmitting layer may have a high transmittance of greater than or equal to about 80%, greater than or equal to about 85%, greater than or equal to about 88%, or greater than or equal to about 90%, and may include an optically transparent conductor. The light transmittance of the light transmitting layer may, in addition to being greater than or equal to at least one of the aforementioned transmittance values, be equal to or less than 100%, equal to or less than about 99%, equal to or less than about 90%, equal to or less than about 88%, equal to or less than about 85%, or equal to or less than about 80%. The light-transmitting layer may include at least one of an oxide conductor, a carbon conductor, and/or a metal thin film. The oxide conductor may include, for example, one or more selected from indium tin oxide (ITO), indium zinc oxide (IZO), zinc tin oxide (ZTO), aluminum tin oxide (ATO), and/or aluminum zinc oxide (AZO). The carbon conductor may be one or more selected from graphene and/or carbon nano-bodies. The metal thin film may be, for example, a metal thin film with a thin thickness of several nanometers to tens of nanometers, or a single layer or multiple layers doped with metal oxide with a thin thickness of several nanometers to several tens of nanometers.

For example, the first electrode 110 may be formed of (e.g., at least partially or completely comprise) a reflective layer or may be a stacked structure of a reflective layer/light-transmitting layer or a light-transmitting layer/reflective layer/light-transmitting layer.

The second electrode 120 may include (e.g., may at least partially or completely comprise) a semi-transmissive layer. The semi-transmissive layer may have a light transmittance between the light-transmitting layer and the reflective layer, and may have a light transmittance of about 10% to about 70%, about 20% to about 60%, or about 30% to about 50%. The semi-transmissive layer, for example, may be configured to selectively transmit light in a particular (or, alternatively, predetermined) wavelength region and reflect or absorb light in other wavelength regions. The semi-transmissive layer may include, for example, a thin metal layer or an alloy layer of about 1 nm to about 50 nm and may include, for example, silver (Ag), copper (Cu), aluminum (Al), magnesium (Mg), magnesium-silver (Mg—Ag), magnesium-aluminum (Mg—Al), or any combination thereof, but is not limited thereto.

For example, the second electrode 120 may further include an inorganic nano-layer in addition to the semi-transmissive layer. The inorganic nano-layer may be disposed facing the light absorbing layer 130 (e.g., in direct contact with the light absorbing layer 130 and/or proximate to the light absorbing layer 130 in relation to a surface of the second electrode 120 that is distal from the light absorbing layer 130), for example, may be formed under the semi-transmissive layer in a thin thickness (e.g., between the semi-transmissive layer and the light absorbing layer 130). For example, the inorganic nano-layer may be in contact (e.g., direct contact) with the semi-transmissive layer. The inorganic nano-layer may be a very thin film of several nanometers in thickness, for example, may have a thickness of less than or equal to about 5 nm, for example less than or equal to about 3 nm, or less than or equal to about 2 nm. The inorganic nano-layer may have, for example, a thickness of greater than or equal to about 0.01 nm, greater than or equal to about 0.1 nm, greater than or equal to about 0.5 nm, or greater than or equal to about 1 nm. The inorganic nano-layer may have, for example, a thickness of about 1 nm to about 5 nm, about 1 nm to about 4 nm, about 1 nm to about 3 nm, or about 1 nm to about 2 nm. The inorganic nano-layer may include an inorganic material having a shallower work function than the semi-transmissive layer, for example, a lanthanide element such as ytterbium (Yb); calcium (Ca); potassium (K); barium (Ba); magnesium (Mg); lithium fluoride (LiF); or an alloy thereof. An effective work function of the surface of the second electrode 120 facing the light absorbing layer 130 may be lowered due to the inorganic nano-layer, and thus facilitate extraction of charge carriers (for example, electrons) moving from the light absorbing layer 130 to the second electrode 120, thereby reducing remaining charge carriers at the interface of the second electrode 120 and the light absorbing layer 130 and improving charge extraction efficiency.

The light absorbing layer 130 includes (e.g., at least partially or completely comprises) a near-infrared absorbing material configured to absorb light in a portion (e.g., some or all) of the infrared wavelength region. The near-infrared absorbing material may be an organic material, an inorganic material, an organic-inorganic material, or any combination thereof. For example, the near-infrared absorbing material may be an organic material, for example, a non-polymer or a polymer, for example, a low-molecular weight compound that may be deposited.

The near-infrared absorbing material may include for example a quantum dot, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, a diquinone compound, a naphthoquinone compound, a squarylium compound, a rylene compound, a perylene compound, a pyrylium compound, a squaraine compound, a thiopyrylium compound, a diketopyrrolopyrrole) compound, a boron-dipyrromethene compound, a nickel-dithiol complex compound, a croconium compound, a derivative thereof, or a combination thereof, but is not limited thereto.

The near-infrared absorbing material may include a compound represented by Chemical Formula 1.

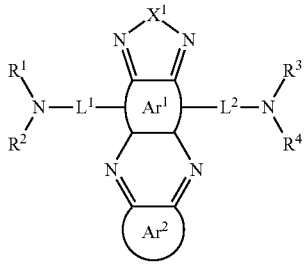

[Chemical Formula 1]

In Chemical Formula 1, $Ar^1$ is a substituted or unsubstituted C6 to C30 aromatic ring, a substituted or unsubstituted C3 to C30 heteroaromatic ring, or a combination thereof, $Ar^2$ is a substituted or unsubstituted C6 to C30 aromatic ring, a substituted or unsubstituted C3 to C30 heteroaromatic ring, or a combination thereof, $X^1$ is O, S, Se, Te, S(=O), S(=$O_2$), $NR^a$, $CR^bR^c$, or $SiR^dR^e$ (wherein $R^a$, $R^b$, $R^c$, $R^d$, and $R^e$ are independently hydrogen, a C1 to C6 alkyl group, a C1 to C6 haloalkyl group, a C6 to C12 aryl group, a C3 to C12 heteroaryl group, a halogen, a cyano group, or a combination thereof), $L^1$ and $L^2$ are independently a substituted or unsubstituted C3 to C20 heteroarylene group, or a fused ring of a substituted or unsubstituted C6 to C20 arylene group and a substituted or unsubstituted C3 to C20 heteroarylene group, $R^1$, $R^2$, $R^3$, and $R^4$ are independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C3 to C30 heteroaryl group, a substituted or unsubstituted silyl group, a halogen, or a combination thereof, and $R^1$ and $R^2$ may independently be present or be linked to each other to form a ring, and $R^3$ and $R^4$ may independently be present or be linked to each other to form a separate ring.

The absorption spectrum in the infrared wavelength region of the light absorbing layer 130 may be substantially the same as the absorption spectrum of the near-infrared absorbing material.

Referring to FIG. 2, the absorption spectrum in the infrared wavelength region of the light absorbing layer 130 may have at least two peaks, for example, a first absorption spectrum (P1) having a main absorption peak (e.g., a main absorption peak, also referred to as a first absorption peak and/or a first peak absorption intensity) in a relatively short wavelength region (hereinafter referred to as "a first infrared wavelength region (A1)") of the infrared wavelength region and a second absorption spectrum (P2) having a sub-absorption peak (e.g., a sub-absorption peak, also referred to as a second absorption peak and/or a second peak absorption intensity) in a region (hereinafter referred to as "a second infrared wavelength region (A2)") having a longer wavelength than that of the first infrared wavelength region. An absorption peak at a particular wavelength may be referred to as a peak absorption intensity at said particular wavelength. The second absorption spectrum (P2) and the first absorption spectrum (P1) may be understood to be separate from each other (e.g., may not at least partially overlap with each other), such that there is no wavelength that is included in both the first absorption spectrum (P1) and the second absorption spectrum (P2) and a shortest wavelength in the second absorption spectrum P2 may be longer than a longest wavelength in the first absorption spectrum P1, such that the second infrared wavelength region A2 may be understood to be a region having a longer wavelength than that of the first infrared wavelength region A1. The second infrared wavelength region A2 may include longer wavelengths than the first infrared wavelength region A1 and may not at least partially overlap with the first infrared wavelength region A1, for example a shortest wavelength in the second infrared wavelength region A2 may be longer than a longest wavelength in the first infrared wavelength region A1, such that the second infrared wavelength region A2 may be understood to be a region having a longer wavelength than that of the first infrared wavelength region A1. A height (e.g., magnitude, intensity, etc.) of the sub-absorption peak may be lower than a height (e.g., magnitude, intensity, etc.) of the main absorption peak.

The first absorption spectrum (P1) may be a main absorption spectrum of the near-infrared absorbing material, and a wavelength ($\lambda_1$) at the absorption peak of the first absorption spectrum (P1) (e.g., a wavelength of the first peak absorption intensity) may be a maximum absorption wavelength ($\lambda_{max}$) of the near-infrared absorbing material and thus may be a maximum absorption wavelength of the infrared sensor 100, which may be within a range of about 700 nm to about 1000 nm. Accordingly, it will be understood that a light absorbing layer 130 including the near-infrared absorbing material may have a maximum absorption wavelength (e.g., a wavelength of incident light at which the light absorbing layer 130 exhibits maximum absorption) that is within a range of about 700 nm to about 1000 nm. The near-infrared absorbing material may be considered to be configured to absorb light in both the first absorption spectrum (P1) and the second absorption spectrum (P2). The wavelength ($\lambda_1$) at the absorption peak of the first absorption spectrum (P1) (e.g., the wavelength at the first absorption peak, which may be referred to as a first absorption peak wavelength, a wavelength of the first peak absorption intensity, or the like) may be, for example, greater than about 700 nm and less than about 1000 nm (e.g., a wavelength within a range, also referred to herein as a wavelength spectrum, of about 700 nm to about 1000 nm), within the range, greater than about 700 nm and less than or equal to about 990 nm, about 750 nm to about 990 nm, about 780 nm to about 990 nm, about 800 nm to about 990 nm, about 820 nm to about 990 nm, or about 850 nm to about 990 nm.

The second absorption spectrum (P2) may be a sub-absorption spectrum having a lower absorption intensity than the first absorption spectrum (P1), and the wavelength ($\lambda_2$) at the absorption peak of the second absorption spectrum (P2) (e.g., the wavelength at the second absorption peak, which may be referred to as a second absorption peak wavelength, a wavelength of the second peak absorption intensity, or the like) may be a longer wavelength than the wavelength ($\lambda_1$) at the absorption peak of the first absorption spectrum (P1) (e.g., the first absorption peak wavelength). For example, a difference between the wavelength ($\lambda_2$) at the absorption peak of the second absorption spectrum (P2) and the wavelength ($\lambda_1$) at the absorption peak of the first absorption spectrum (P1) may be greater than or equal to about 100 nm, for example greater than or equal to about 120 nm, greater than or equal to about 150 nm, greater than or equal to about 180 nm, greater than or equal to about 200 nm, greater than or equal to about 250 nm, greater than or equal to about 300 nm, greater than or equal to about 350 nm, greater than or equal to about 400 nm, greater than or equal to about 450 nm, greater than or equal to about 500 nm, greater than or equal to about 550 nm, greater than or equal to about 600 nm, greater than or equal to about 700 nm, greater than or equal to about 800 nm, greater than or equal to about 900 nm or greater than or equal to about 1000 nm, for example equal to or less than about 2000 nm, for example about 120 nm to about 2000 nm, about 150 nm to about 2000 nm, about 180 nm to about 2000 nm, about 200 nm to about 2000 nm, about 250 nm to about 2000 nm, about 300 nm to about 2000 nm, about 350 nm to about 2000 nm, about 400 nm to about 2000 nm, about 450 nm to about 2000 nm, about 500 nm to about 2000 nm, about 550 nm to about 2000 nm, about 600 nm to about 2000 nm, about 700 nm to about 2000 nm, about 800 nm to about 2000 nm, about 900 nm to about 2000 nm, or about 1000 nm to about 2000 nm.

For example, the wavelength ($\lambda_2$) at the absorption peak of the second absorption spectrum (P2) may be about 1000 nm to about 3000 nm, within the range, for example about 1050 nm to about 3000 nm, about 1100 nm to about 3000 nm, about 1150 nm to about 3000 nm, about 1200 nm to about 3000 nm, about 1300 nm to about 3000 nm, about 1050 nm to about 2500 nm, about 1100 nm to about 2500 nm, about 1150 nm to about 2500 nm, about 1200 nm to about 2500 nm, about 1300 nm to about 2500 nm, about 1050 nm to about 2000 nm, about 1100 nm to about 2000 nm, about 1150 nm to about 2000 nm, about 1200 nm to about 2000 nm, about 1300 nm to about 2000 nm, about 1050 nm to about 1800 nm, about 1100 nm to about 1800 nm, about 1150 nm to about 1800 nm, about 1200 nm to about 1800 nm, or about 1300 nm to about 1800 nm.

It will be understood that where a wavelength, intensity, property, or the like is referred to as being "about" a first value to a second value, said wavelength, intensity, property, or the like may be interchangeably referred to herein as being within a range of about the first value to about the second value.

An absorption intensity ($Abs_1$) at the absorption peak of the first absorption spectrum (P1), also referred to herein as a first absorption intensity, may be greater than an absorption intensity ($Abs_2$) at the absorption peak of the second absorption spectrum (P2), also referred to herein as a second absorption intensity, and may, for example, satisfy Relationship Equation 1.

$$0.1 \leq Abs_2/Abs_1 \leq 0.8 \quad \text{[Relationship Equation 1]}$$

In Relationship Equation 1, $Abs_1$ is the absorption intensity at the absorption peak of the first absorption spectrum (e.g., the first absorption intensity), and $Abs_2$ is the absorption intensity at the absorption peak of the second absorption spectrum (e.g., the second absorption intensity).

For example, Relationship Equation 1 may satisfy Relationship Equation 1a.

$$0.1 \leq Abs_2/Abs_1 \leq 0.6 \quad \text{[Relationship Equation 1a]}$$

As an example, Relationship Equation 1 may satisfy Relationship Equation 1b.

$$0.1 \leq Abs_2/Abs_1 \leq 0.5 \quad \text{[Relationship Equation 1 b]}$$

As an example, Relationship Equation 1 may satisfy Relationship Equation 1c.

$$0.1 \leq Abs_2/Abs_1 \leq 0.3 \quad \text{[Relationship Equation 1c]}$$

As an example, Relationship Equation 1 may satisfy Relationship Equation 1d.

$$0.1 \leq Abs_2/Abs_1 \leq 0.2 \quad \text{[Relationship Equation 1d]}$$

In some example embodiments, the wavelength having the lowest reflectance in a reflection spectrum in an infrared wavelength region of the light absorbing layer 130 is the same as the wavelength ($\lambda_2$) in the absorption peak of the second absorption spectrum or may be within ±100 nm, ±80 nm, ±70 nm, ±50 nm, ±40 nm, ±30 nm, ±20 nm, ±10 nm, or ±5 nm.

The light absorbing layer 130 is a photoelectric conversion layer configured to convert absorbed light into an electrical signal. The light absorbing layer 130 may be configured to generate a current in a particular (or, alternatively, predetermined) wavelength region based on the aforementioned absorption characteristics. This will be described later.

The light absorbing layer 130 may form a pn junction for photoelectric conversion, and the aforementioned near-infrared absorbing material may be a p-type semiconductor or an n-type semiconductor. The light absorbing layer 130 may further include a counter material for forming a pn junction with the near-infrared absorbing material. Restated, the light absorbing layer 130 as shown in FIG. 1 may include a near-infrared absorbing material and a counter material that forms (e.g., defines) a pn junction with the near-infrared absorbing material, e.g., the light absorbing layer 130 may include a mixture or stack of layers including the near-infrared absorbing material and the counter material that collectively define a pn junction. For example, when the near-infrared absorbing material is a p-type semiconductor, the counter material may be an n-type semiconductor. For example, when the near-infrared absorbing material is an n-type semiconductor, the counter material may be a p-type semiconductor. The counter material may be, for example, an organic material, an inorganic material, or an organic-inorganic material. The counter material may be a light absorbing material or a non-light absorbing material.

In some example embodiments, the light absorbing layer 130 may include a near-infrared absorbing material that is a p-type semiconductor, such as Sn naphthaloxyanine and/or Sn naphthalocyanine, and a counter material (B) that is an n-type semiconductor, such as C60.

The light absorbing layer 130 may include a mixed layer in which the near-infrared absorbing material and the counter material are mixed in a bulk heterojunction form. The mixed layer may include the near-infrared absorbing material and the counter material in a particular (or, alternatively, predetermined) composition ratio, where the composition ratio may be defined as a volume or thickness of the near-infrared absorbing material relative to a volume or thickness of the counter material.

For example, the near-infrared absorbing material may be included in the light absorbing layer 130 in an amount that is less than or equal to that of the counter material in the light absorbing layer 130, for example, the composition ratio of the near-infrared absorbing material relative to the counter material may be about 0.10 to about 1.00. The composition ratio of the near-infrared absorbing material relative to the counter material may be about 0.10 to about 1.00, about 0.20 to about 1.00, about 0.30 to about 1.00, about 0.40 to about 1.00, about 0.50 to about 1.00, about 0.10 to about 0.90, about 0.20 to about 0.90, about 0.30 to about 0.90, about 0.40 to about 0.90, about 0.50 to about 0.90, 0.20 to about 0.80, about 0.30 to about 0.80, about 0.40 to about 0.80, about 0.50 to about 0.80, about 0.10 to about 0.70, or about 0.10 to about 0.50.

The light absorbing layer 130 may have a thickness of about 50 nm to about 1000 nm, and may have a thickness of about 80 nm to about 1000 nm, about 100 nm to about 1000 nm, about 120 nm to about 1000 nm, or 150 nm to about 1000 nm.

The buffer layers 140 and 150 include at least one first buffer layer 140 between the first electrode 110 and the light absorbing layer 130 and at least one second buffer layer 150 between the second electrode 120 and the light absorbing layer 130. Each of the first buffer layer 140 and the second buffer layer 150 may be independently a charge auxiliary layer configured to control mobility of holes and/or electrons separated from the light absorbing layer 130 or a light absorbing auxiliary layer to improve light absorption characteristics. For example, the first buffer layer 140 and the second buffer layer 150 may include one or more selected from a hole injecting layer (HIL), a hole transporting layer (HTL), an electron blocking layer (EBL), an electron injecting layer (EIL), an electron transporting layer (ETL), a hole blocking layer (HBL), and a light absorbing auxiliary layer. The first buffer layer 140 and the second buffer layer 150 may independently include an organic material, an inorganic material, an organic-inorganic material, or a combination thereof (e.g., a triphenylamine derivative).

The buffer layers 140 and 150 may have independently a thickness of about 2 nm to about 200 nm, within the range, about 5 nm to about 200 nm, about 5 nm to about 190 nm, or about 5 nm to about 180 nm. At least one of the first buffer layer 140 or the second buffer layer 150 may be omitted.

The infrared sensor 100 may further include an anti-reflection layer (not shown) and/or an encapsulant (not shown) disposed on the second electrode 120.

As described above, the infrared sensor 100 includes a first electrode 110 including a reflective layer, a second electrode 120 including a semi-transmissive layer, and a light absorbing layer 130 and buffer layers 140 and 150 therebetween, and thus a microcavity structure (also referred to herein as simply a "microcavity") may be formed. Restated, the first electrode 110 and the second electrode 120 may be configured to collectively define a microcavity in the infrared sensor 100. Due to the microcavity structure, incident light may be configured to be repeatedly reflected between the reflective layer and the semi-transmissive layer which are separated by a particular (or, alternatively, predetermined) distance (namely, optical path length) to enhance light of a particular (or, alternatively, predetermined) wavelength spectrum. For example, light of a particular (or, alternatively, predetermined) wavelength spectrum among the incident light may be modified by repeatedly reflecting between the reflective layer and the semi-transmissive layer, and among the modified light, light of a wavelength spectrum corresponding to a resonance wavelength of the microcavity may be enhanced to exhibit amplified photoelectric conversion characteristics in a narrow wavelength region.

As described above, the absorption spectrum of the light absorbing layer 130 is the first absorption spectrum (P1) having a main absorption peak in the first infrared wavelength region (A1), which is a region of the infrared wavelength region having a relatively short wavelength and a second absorption spectrum (P2) having a sub-absorption peak in the second infrared wavelength region (A2), which is region having a longer wavelength than that of the first infrared wavelength region (A1).

Based on such optical properties of the light absorbing layer 130, a microcavity structure may be formed to have amplified photoelectric conversion characteristics in the second infrared wavelength region (A2) having the sub-absorption peak. Accordingly, the infrared sensor 100 includes a near-infrared absorbing material having the main absorption peak in the relatively short wavelength region of less than about 1000 nm and may be configured to photoelectrically convert and effectively sense light of the infrared wavelength spectrum in the relatively long wavelength region of greater than or equal to about 1000 nm, for example, greater than or equal to about 1100 nm. Accordingly, the infrared sensor 100 may overcome a limit of the absorption wavelength of the near-infrared absorbing material and be realized with a desired target wavelength and effectively used, such that light-sensing performance of the infrared sensor 100 is improved.

The photoelectric conversion characteristics of the infrared sensor 100 may be expressed to photoelectric conversion efficiency, and the photoelectric conversion efficiency may be in general evaluated from external quantum efficiency (EQE). The external quantum efficiency (EQE) may be a ratio of extracted charges relative to incident photons. In other words, high EQE regarding a particular (or, alternatively, predetermined) wavelength region (e.g., a local peak EQE within the particular wavelength region) may mean that the infrared sensor 100 may have high photoelectric conversion characteristics in the particular (or, alternatively, predetermined) wavelength region and be configured to effectively generate a current.

Figure 3:
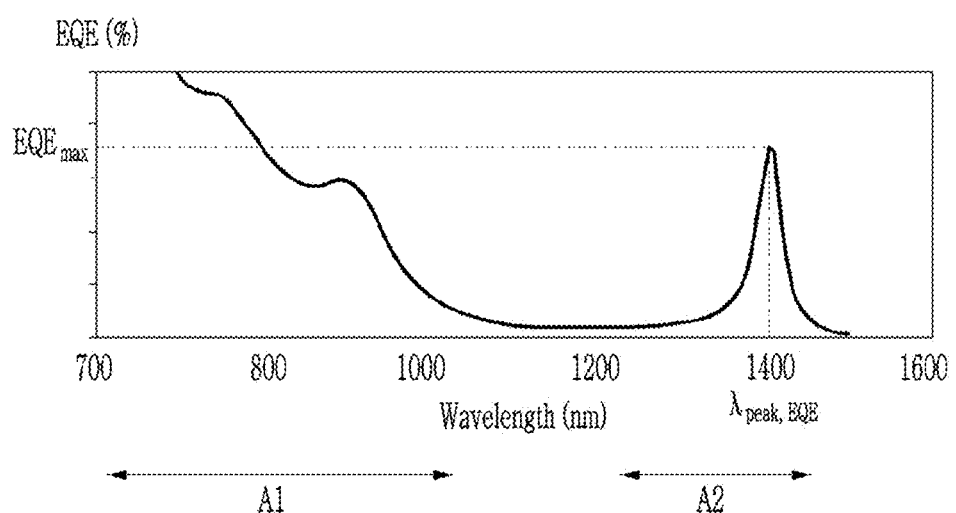
FIG. 3 is an EQE spectrum of an example of the infrared sensor of FIG. 1, according to some example embodiments.

FIG. 3 is an EQE spectrum of an example of the infrared sensor of FIG. 1, according to some example embodiments. Referring to FIG. 3, the infrared sensor 100 has amplified photoelectric conversion characteristics in the second infrared wavelength region (A2) having the sub-absorption peak and thus may exhibit an amplified EQE spectrum in the second infrared wavelength region (A2). Herein, "amplified" may mean that since EQE is greatly increased compared with absorption intensity of the absorption spectrum in the corresponding wavelength region, and a full width at half maximum (FWHM) of the EQE spectrum is greatly narrowed compared with a full width at half maximum (FWHM) of the absorption spectrum in the corresponding wavelength region, detection selectivity is thus increased. The full width at half maximum (FWHM) of the absorption spectrum may be a width of a wavelength corresponding to a half of the absorption peak, and the full width at half maximum (FWHM) of the EQE spectrum may be a width of a wavelength corresponding to a half of an EQE maximum value in the EQE spectrum. For example, the amplified EQE spectrum in the microcavity structure may be confirmed by comparing with the EQE spectrum in the infrared sensor that does not form the microcavity structure.

When the external quantum efficiency (EQE) spectrum in the second infrared wavelength region A2 is amplified, and as shown in FIGS. 2-3, the EQE may exhibit a local peak value (e.g., peak wavelength of the EQE spectrum) in the second infrared wavelength region that has a greater variance from the rest of (e.g., a remainder of) the EQE values of the EQE spectrum in the second infrared wavelength region A2 than the variance of the absorption peak value of the second absorption spectrum P2 from the rest values (e.g., absorption intensities) of the second absorption spectrum P2 in the second infrared wavelength region A2 and/or the full width at half maximum (FWHM) of the EQE spectrum in the second infrared wavelength region A2 may be narrower than the full width at half maximum (FWHM) of the second absorption spectrum P2 in the second infrared wavelength region A2. For example, the variance of the peak wavelength of the EQE spectrum from the rest EQE values of the EQE spectrum in the second infrared wavelength region A2 may be greater than or equal to about 10%, 30%, 50%, 70%, 90%, 100%, 150%, 200%, 500%, 1000%, or greater than 100% of the variance of the peak of the absorption peak of the second absorption spectrum P2 from the rest values of the of the second absorption spectrum P2 in the second infrared wavelength region A2. In another example, the full width at half maximum (FWHM) of the EQE spectrum in the second infrared wavelength region A2 is less than or equal to 90%, 70%, 50%, 30%, 20%, 10%, 5%, and/or 1%, and/or greater than 0%, of the full width at half maximum (FWHM) of the second absorption spectrum P2 in the second infrared wavelength region A2.

Accordingly, it will be understood that an external quantum efficiency (EQE) spectrum in the second infrared wavelength region A2 may be amplified, such that a variance of a maximum EQE value ($EQE_{max}$) (e.g., local maximum EQE value) at a peak wavelength of the EQE spectrum from a remainder of EQE values of the EQE spectrum in the second infrared wavelength region A2 is greater than a variance of the second absorption peak at the wavelength ($\lambda_2$) from absorption values at a remainder of absorption intensities of the second absorption spectrum P2 in the second infrared wavelength region A2, and/or a full width at half maximum (FWHM) of the EQE spectrum in the second infrared wavelength region A2 is smaller (e.g., narrower) than a full width at half maximum (FWHM) of the second absorption spectrum P2 in the second infrared wavelength region A2.

As shown in FIGS. 2-3, the amplified EQE spectrum may be characterized in that, when a maximum absorption wavelength of the infrared sensor 100 is within a range of about 700 nm to about 1000 nm, the EQE spectrum of the infrared sensor 100 has a local maximum EQE value ($EQE_{max}$) at a local peak wavelength ($\lambda_{peak,EQE}$) that is greater than about 1000 nm, such that EQE values of the EQE spectrum of the infrared sensor 100 at all wavelengths up to 100 nm shorter than the local peak wavelength are smaller than the local maximum EQE value ($EQE_{max}$), and EQE values of the EQE spectrum of the infrared sensor 100 at all wavelengths up to 100 nm longer than the local peak wavelength ($\lambda_{peak,EQE}$) are smaller than the local maximum EQE value ($EQE_{max}$). For example, even if EQE values of the EQE spectrum of the infrared sensor 100 at wavelengths shorter than about 1000 nm are greater than EQE values of the EQE spectrum of the infrared sensor 100 at wavelengths longer than about 1000 nm, it may include a localized peak EQE value having a local maximum EQE value ($EQE_{max}$) (e.g., at about 1300 nm) that is greater than all other EQE values within 100 nm of the wavelength at which the local maximum EQE value ($EQE_{max}$) exists in the EQE spectrum of the infrared sensor 100 (e.g., all other EQE values at about 1200 nm to about 1300 nm and about 1300 nm to about 1400 nm).

For example, an EQE maximum value ($EQE_{max}$) (e.g., peak EQE value, EQE value at peak wavelength of the EQE spectrum, local maximum EQE value, etc.) in the second infrared wavelength region (A2) of the infrared sensor 100 (e.g., a wavelength region of greater than or equal to about 1100 nm, about 1100 nm to about 2000 nm, etc.) may be greater than or equal to about 4%, within the range, greater than or equal to about 5%, greater than or equal to about 7%, greater than or equal to about 10%, greater than or equal to about 12%, greater than or equal to about 15%, greater than or equal to about 18%, greater than or equal to about 20%, greater than or equal to about 22%, greater than or equal to about 25%, greater than or equal to about 28%, or greater than or equal to about 30%. The EQE maximum value ($EQE_{max}$) in the second infrared wavelength region (A2) of the infrared sensor 100 may be less than or equal to 100%, less than or equal to about 90%, less than or equal to about 70%, or less than or equal to about 50%.

For example, the full width at half maximum (FWHM) of the EQE spectrum in the second infrared wavelength region (A2) of the infrared sensor 100 may be narrower (e.g., smaller) than the full width at half maximum (FWHM) of the EQE spectrum in the first infrared wavelength region (A1). For example, the full width at half maximum (FWHM) of the EQE spectrum in the second infrared wavelength region (A2) of the infrared sensor 100 may be less than or equal to about 300 nm, within the range, less than or equal to about 280 nm, less than or equal to about 260 nm, less than or equal to about 240 nm, less than or equal to about 220 nm, less than or equal to about 200 nm, less than or equal to about 180 nm, less than or equal to about 160 nm, less than or equal to about 150 nm, less than or equal to about 120 nm, less than or equal to about 100 nm, or less than or equal to about 10 nm. The full width at half maximum (FWHM) of the EQE spectrum in the second infrared wavelength region (A2) of the infrared sensor 100 may, in addition to being less than or equal to any of the aforementioned values, be greater than or equal to about 10 nm. The full width at half maximum (FWHM) of the EQE spectrum in the second infrared wavelength region (A2) of the infrared sensor 100 may be about 10 nm to about 300 nm, about 10 nm to about 280 nm, about 10 nm to about 260 nm, about 10 nm to about 240 nm, about 10 nm to about 220 nm, about 10 nm to about 200 nm, about 10 nm to about 180 nm, about 10 nm to about 160 nm, about 10 nm to about 150 nm, about 10 nm to about 120 nm, or about 10 nm to about 100 nm.

The infrared sensor 100 may obtain an amplified EQE spectrum having a peak wavelength ($\lambda_{peak,EQE}$) belonging to (also referred to herein interchangeably as being within) the second infrared wavelength region (A2) by adjusting a resonance wavelength of the microcavity structure. It will be understood that the peak wavelength ($\lambda_{peak,EQE}$) of the EQE spectrum in the second infrared wavelength region (A2) may be referred to as a local peak wavelength of the EQE spectrum (e.g., a local peak wavelength of the EQE spectrum in the second infrared wavelength region) and the EQE value at the local peak wavelength may be referred to as a local maximum EQE value of the EQE spectrum (e.g., a local maximum EQE value of the EQE spectrum in the second infrared wavelength region. For example, the peak wavelength ($\lambda_{peak,EQE}$) belonging to the second infrared wavelength region (A2) may correspond to (e.g., may be at least partially defined by) a resonance wavelength of the microcavity structure. For example, the peak wavelength ($\lambda_{peak,EQE}$) belonging to the second infrared wavelength region (A2) may be the same as the wavelength at the absorption peak in the absorption spectrum or the wavelength showing the lowest reflectivity in the reflection spectrum or may be within ±100 nm, ±80 nm, ±70 nm, ±50 nm, ±40 nm, ±30 nm, ±20 nm, ±10 nm, or ±5 nm. The peak wavelength ($\lambda_{peak,EQE}$) of the EQE spectrum in the second infrared wavelength region (A2) may in a range between, for example, about 1000 nm to about 3000 nm, within the range, for example about 1050 nm to about 3000 nm, about 1100 nm to about 3000 nm, about 1150 nm to about 3000 nm, about 1200 nm to about 3000 nm, about 1300 nm to about 3000 nm, about 1050 nm to about 2500 nm, about 1100 nm to about 2500 nm, about 1150 nm to about 2500 nm, about 1200 nm to about 2500 nm, about 1300 nm to about 2500 nm, about 1050 nm to about 2000 nm, about 1100 nm to about 2000 nm, about 1150 nm to about 2000 nm, about 1200 nm to about 2000 nm, about 1300 nm to about 2000 nm, about 1050 nm to about 1800 nm, about 1100 nm to about 1800 nm, about 1150 nm to about 1800 nm, about 1200 nm to about 1800 nm, or about 1300 nm to about 1800 nm.

The peak wavelength ($\lambda_{peak,EQE}$) of the EQE spectrum may be controlled by various factors, such as an optical path length, which is a distance between the reflective layer and the semi-transmissive layer (e.g., a distance between the reflective layer and the second electrode 120), and/or optical properties between the reflective layer and the semi-transmissive layer. Restated, the peak wavelength ($\lambda_{peak,EQE}$) of the EQE spectrum may be at least partially defined by (e.g., determined by) an optical path length, which is a distance between the reflective layer and the semi-transmissive layer (e.g., a distance between the reflective layer and the second electrode 120).

For example, the peak wavelength ($\lambda_{peak,EQE}$) of the EQE spectrum of the infrared sensor 100 may be determined by an optical length, which is a distance between the reflective layer and the semi-transmissive layer, and as the optical length is larger, the peak wavelength ($\lambda_{peak,EQE}$) of the EQE spectrum may be shifted toward the longer wavelength region. For example, as the distance between the reflective layer and the second electrode 120 increases, the peak wavelength of the external quantum efficiency (EQE) spectrum in the second infrared wavelength region may be shifted to a longer wavelength region, such that a wavelength magnitude of the peak wavelength of the external quantum efficiency (EQE) spectrum in the second infrared wavelength region may be proportional (e.g., directly proportional) to the distance between the reflective layer and the second electrode 120.

For example, in the infrared sensor 100 of FIG. 1, the peak wavelength ($\lambda_{peak,EQE}$) of the EQE spectrum in the second infrared wavelength region (A2) may be controlled by (e.g., at least partially defined by) at least one of a thickness of the light absorbing layer 130 or a thickness of one or more of the buffer layers 140 and/or 150.

For example, in the second infrared wavelength region (A2), the peak wavelength ($\lambda_{peak,EQE}$) of the EQE spectrum may be controlled by the thickness of the light absorbing layer 130. For example, as the thickness of the light absorbing layer 130 is thicker, the peak wavelength of the EQE spectrum in the second infrared wavelength region (A2) may be shifted toward the longer wavelength region. For example, as the thickness of the light absorbing layer 130 increases, the peak wavelength of the external quantum efficiency (EQE) spectrum in the second infrared wavelength region may be shifted to a longer wavelength region, such that a wavelength magnitude of the peak wavelength of the external quantum efficiency (EQE) spectrum in the second infrared wavelength region may be proportional (e.g., directly proportional) to the thickness of the light absorbing layer 130.

For example, in the second infrared wavelength region (A2), the peak wavelength ($\lambda_{peak,EQE}$) of the EQE spectrum may be controlled by the thicknesses of the buffer layers 140 and 150. For example, as the thicknesses of the buffer layers 140 and 150 are thicker, the peak wavelength of the EQE spectrum in the second infrared wavelength region (A2) may be shifted toward the longer wavelength region.

For example, in the second infrared wavelength region (A2), the peak wavelength ($\lambda_{peak,EQE}$) of the EQE spectrum may be controlled by a thickness sum of the light absorbing layer 130 and the buffer layers 140 and 150. For example, as the thickness sum of the light absorbing layer 130 and the buffer layers 140 and 150 is larger, the peak wavelength of the EQE spectrum in the second infrared wavelength region (A2) may be shifted toward the longer wavelength region. In another example, as the thickness at least one of the buffer layers 140 and/or 150 increases, the peak wavelength of the external quantum efficiency (EQE) spectrum in the second infrared wavelength region may be shifted to a longer wavelength region, such that a wavelength magnitude of the peak wavelength of the external quantum efficiency (EQE) spectrum in the second infrared wavelength region may be proportional (e.g., directly proportional) to the thickness of the at least one buffer layer 140 and/or 150.

For example, the peak wavelength ($\lambda_{peak,EQE}$) of the EQE spectrum in the second infrared wavelength region (A2) may be controlled by an absorption coefficient of the near-infrared absorbing material included in the light absorbing layer 130. For example, as the absorption coefficient of the near-infrared absorbing material is higher, the peak wavelength ($\lambda_{peak,EQE}$) of the EQE spectrum in the second infrared wavelength region (A2) may be shifted toward the longer wavelength region.

For example, the peak wavelength ($\lambda_{peak,EQE}$) of the EQE spectrum in the second infrared wavelength region (A2) may be controlled by (e.g., at least partially defined by) a composition ratio (a volume ratio or a thickness ratio) of the near-infrared absorbing material and the counter material included in the light absorbing layer 130. For example, as the composition ratio (the volume ratio or the thickness ratio) of the near-infrared absorbing material relative to the counter material is higher, the peak wavelength ($\lambda_{peak,EQE}$) of the EQE spectrum in the second infrared wavelength region (A2) may be shifted toward the longer wavelength region. Restated, a magnitude of the peak wavelength of the EQE spectrum in the second infrared wavelength region may be proportional (e.g., directly proportional) to the composition ratio of the near-infrared absorbing material relative to the counter material.

In this way, the infrared sensor 100 according to some example embodiments has a structure capable of selecting and controlling a target wavelength for photoelectric conversion in the infrared wavelength region and may be realized and effectively used depending on the desired target wavelength. Particularly, like a wavelength region of greater than or equal to about 1000 nm (e.g., about 1000 nm to about 2000 nm), for example, greater than or equal to about 1100 nm (e.g., about 1100 nm to about 2000 nm), or for example, greater than or equal to about 1200 nm (e.g., about 1200 nm to about 2000 nm), even when the target wavelength belongs to the long wavelength region not sensible in a silicon photodiode, the light of the target wavelength may be effectively photoelectrically converted and thus a usable range of the infrared sensor 100 may be broadened. Accordingly, the infrared sensor 100 may be configured to generate current (e.g., electrical current) based on photoelectrically converting light (e.g., incident light) in a wavelength region of greater than or equal to about 1100 nm (e.g., about 1100 nm to about 2000 nm).

Figure 4:
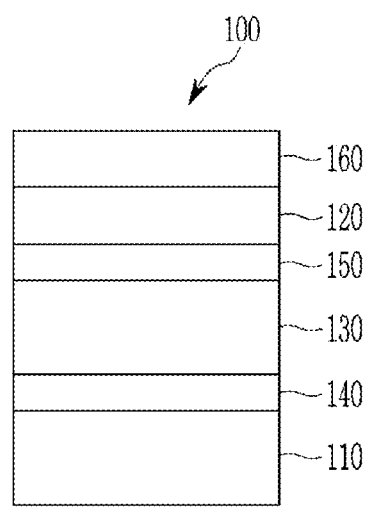
FIG. 4 is a cross-sectional view showing another example of a sensor according to some example embodiments.
Figure 5:
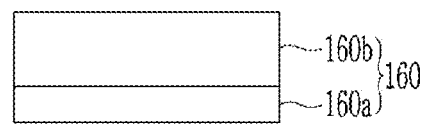
FIG. 5 is a cross-sectional view showing an example of the optical auxiliary layer in the sensor of FIG. 4, according to some example embodiments.

FIG. 4 is a cross-sectional view showing another example of a sensor according to some example embodiments, and FIG. 5 is a cross-sectional view showing an example of the optical auxiliary layer in the sensor of FIG. 4.

Referring to FIG. 4, the infrared sensor 100 according to some example embodiments includes a first electrode 110, a second electrode 120, and a light absorbing layer 130 between the first electrode 110 and the second electrode 120, and buffer layers 140 and 150, as in some example embodiments, including the example embodiments shown in at least FIG. 1.

However, the infrared sensor 100 according to some example embodiments, including the example embodiments shown in FIG. 4 may further include an optical auxiliary layer 160, unlike some example embodiments, including the example embodiments shown in at least FIG. 1. The second electrode 120 as shown in FIG. 4 may include a semi-transmissive layer, a light-transmitting layer, or any combination thereof.

The optical auxiliary layer 160 may be configured to selectively transmit light in a particular (or, alternatively, predetermined) wavelength region among incident light and reflect and/or absorb light in other wavelength regions. That is, the optical auxiliary layer 160 may be a selective transmission layer, for example, a semi-transmissive layer.

Referring to FIG. 5, the optical auxiliary layer 160 may include a first optical auxiliary layer 160a and a second optical auxiliary layer 160b having different refractive indexes. Either one of the first optical auxiliary layer 160a or the second optical auxiliary layer 160b may be a high refractive index layer and have a refractive index of greater than or equal to about 1.55, for example, about 1.55 to about 1.90 in the infrared wavelength region. The other one of the first optical auxiliary layer 160a or the second optical auxiliary layer 160b may be a low refractive index layer and have a refractive index of less than about 1.55, for example, greater than or equal to about 1.20 and less than about 1.55 in the infrared wavelength region. For example, the first optical auxiliary layer 160a may be aluminum oxide, an organic buffer material, an inorganic buffer material, or any combination thereof, and the second optical auxiliary layer 160b may be silicon oxide, silicon nitride, silicon oxynitride, or any combination thereof, but are not limited thereto.

A thickness of the second optical auxiliary layer 160b may be greater than or equal to that of the first optical auxiliary layer 160a, for example, about 1.0 times to about 5.0 times greater than that of the first optical auxiliary layer 160a and within the range, about 1.2 times to about 5 times, about twice to about 5 times, or about 3 times to about 5 times greater than that of the first optical auxiliary layer 160a.

The optical auxiliary layer 160 may further include an additional layer (not shown) in addition to the first optical auxiliary layer 160a and the second optical auxiliary layer 160b.

The optical auxiliary layer 160 is a semi-transmissive layer, and unlike some example embodiments, including the example embodiments shown in at least FIG. 1, the second electrode 120 may not include a separate semi-transmissive layer. In other words, the second electrode 120 may be selected from a light-transmitting layer, a semi-transmissive layer, or any combination thereof. For example, the second electrode 120 and the optical auxiliary layer 160 may be semi-transmissive layers, respectively. For example, the second electrode 120 may be a light-transmitting layer and the optical auxiliary layer 160 may be a semi-transmissive layer.

The light-transmitting layer may have a high transmittance of equal to or less than 100% and greater than or equal to about 80%, greater than or equal to about 85%, greater than or equal to about 88%, or greater than or equal to about 90%, and may include an optically transparent conductor. The light-transmitting layer may include, for example, at least one of an oxide conductor such as indium tin oxide (ITO), indium zinc oxide (IZO), zinc tin oxide (ZTO), aluminum tin oxide (ATO), and aluminum zinc oxide (AZO); a carbon conductor such as graphene and a carbon nanostructure; and/or a metal thin film having a thin thickness of several nanometers to tens of nanometers, or a single layer or multiple layers doped a metal oxide having a thin thickness of several nanometers to several tens of nanometers.

The infrared sensor 100 according to some example embodiments includes the first electrode 110 including a reflective layer, the second electrode 120 including a semi-transmissive layer and/or the optical auxiliary layer 160, and the light absorbing layer 130 and the buffer layers 140 and 150 disposed therebetween and thus may form (e.g., collectively define) the microcavity structure and, as described above, intensify light of a wavelength spectrum corresponding to a resonance wavelength of microcavity to exhibit amplified photoelectric conversion characteristics in the narrow wavelength region. For example, the first electrode 110 and the second electrode 120, or the first electrode 110 and the optical auxiliary layer 160, may collectively define a microcavity structure, and a peak wavelength of an external quantum efficiency (EQE) spectrum in the second infrared wavelength region may be at least partially defined by a resonance wavelength of the microcavity structure. Details are the same as described above. As described herein, an element, property, or the like that is at least partially defined by another element, property, or the like may be understood to be associated with, or corresponding to, the other element, property, or the like.

The infrared sensor 100 may be applied to various fields for sensing light in the infrared wavelength region, for example, an image sensor for improving sensitivity in a low light environment, a sensor for increasing detection capability of 3D images by broadening the dynamic range for detailed black and white contrast, a security sensor, a vehicle sensor, a biometric sensor, or the like, and the biometric sensor may be, for example, an iris sensor, a depth sensor, a fingerprint sensor, a blood vessel distribution sensor, or the like, but is not limited thereto. The infrared sensor 100 may be for example applied to a CMOS infrared sensor or a CMOS image sensor.

Figure 6:
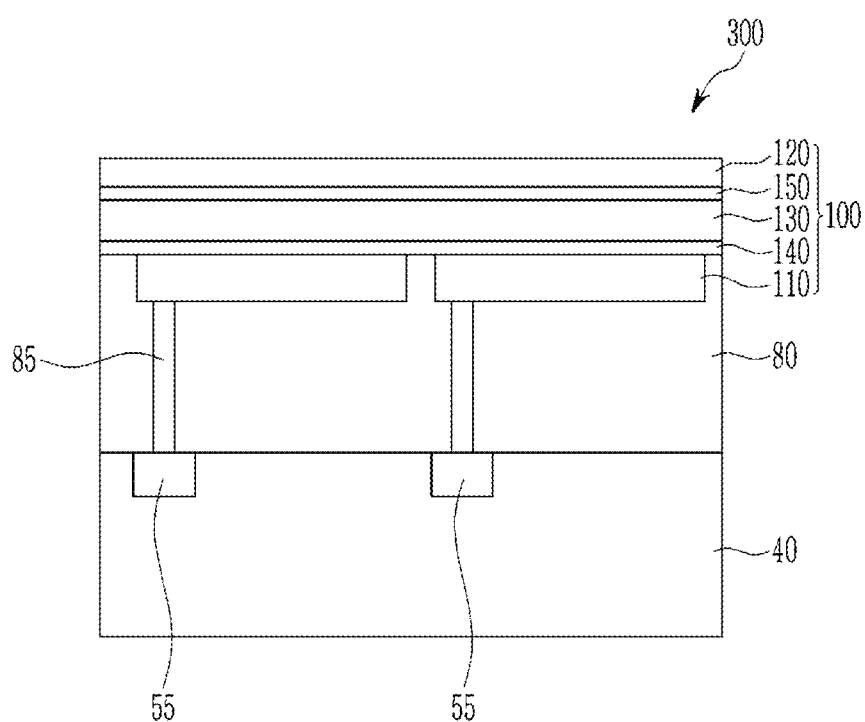
FIG. 6 is a cross-sectional view showing an example of a sensor according to some example embodiments.

FIG. 6 is a cross-sectional view showing an example of a sensor according to some example embodiments.

The sensor 300 according to some example embodiments includes a semiconductor substrate 40, an insulation layer 80, and an infrared sensor 100. The semiconductor substrate 40 may correspond to substrate 101.

The semiconductor substrate 40 may be a silicon substrate, and are integrated with a transfer transistor (not shown) and a charge storage 55. The charge storage 55 may be integrated for each pixel. The charge storage 55 is electrically connected to the infrared sensor 100 and information of the charge storage 55 may be transferred by a transfer transistor.

A metal wire (not shown) and a pad (not shown) are formed on the semiconductor substrate 40. The metal wire and pad may be made of a metal having low resistivity, for example, aluminum (Al), copper (Cu), silver (Ag), and alloys thereof to decrease signal delay, but are not limited thereto. Further, it is not limited to the structure, and the metal wire and pad may be disposed under the semiconductor substrate 40.

The insulation layer 80 is formed on the metal wire and pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 55. The trench 85 may be filled with fillers.

The aforementioned infrared sensor 100 is formed on the insulation layer 80. The infrared sensor 100 includes the first electrode 110, the second electrode 120, the light absorbing layer 130 and the buffer layers 140 and 150, as described above. The infrared sensor 100 may optionally further include the aforementioned optical auxiliary layer 160, an anti-reflection layer, and/or an encapsulant. The infrared sensor 100 is as described above. The infrared sensors 100 may be arranged along rows and/or columns, for example, in a matrix arrangement.

Focusing lens (not shown) may be further formed on the infrared sensor 100. The focusing lens may be configured to control a direction of incident light and gather the light in one region. The focusing lens may have a shape of, for example, a cylinder or a hemisphere, but is not limited thereto.

Figure 7:
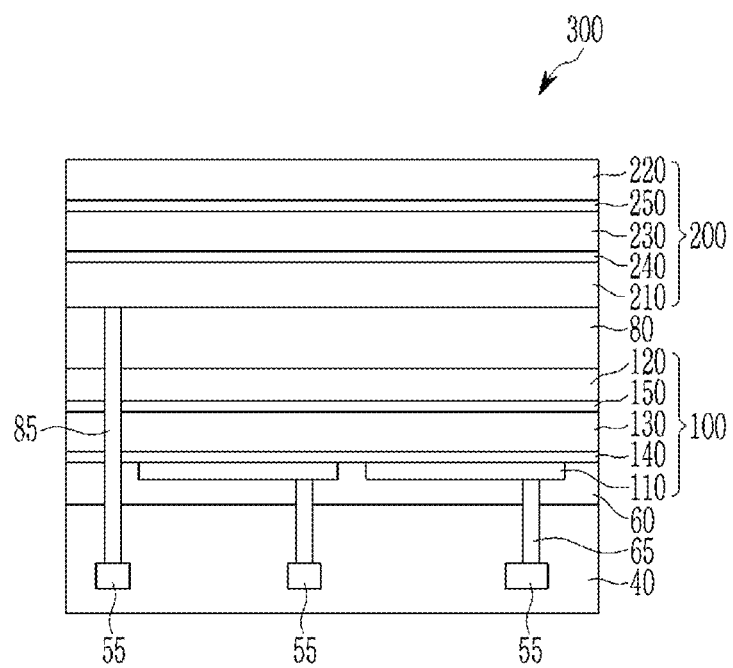
FIG. 7 is a cross-sectional view showing another example of a sensor according to some example embodiments.

FIG. 7 is a cross-sectional view showing another example of a sensor according to some example embodiments.

The sensor according to some example embodiments may include a plurality of sensors having different functions, and the plurality of sensors having different functions may be stacked along a thickness direction of the semiconductor substrate 40.

For example, the plurality of sensors having different functions may be an infrared sensor and/or an image sensor and, for example, independently selected and combined from a sensor for improving sensitivity in a low illumination environment, a sensor for increasing detection capability of 3D images by expanding the dynamic range for detailed division of black and white contrast, a security sensor, a vehicle sensor, a biometric sensor, and an image sensor. The image sensor may be configured to absorb and sense light in a red wavelength region, a green wavelength region, a blue wavelength region, or any combination thereof.

For example, the plurality of sensors may include two infrared sensors. For example, the plurality of sensors may include a first infrared light sensor configured to sense light having a first wavelength within the infrared wavelength region and a second infrared light sensor configured to sense light having a second wavelength within the infrared wavelength region.

The first wavelength and the second wavelength may be, for example, different each other within a wavelength region of greater than about 700 nm and less than or equal to 3000 nm, and for example, the difference between the first wavelength and the second wavelength may be greater than or equal to about 30 nm and within the range, greater than or equal to about 50 nm, greater than or equal to about 70 nm, greater than or equal to about 80 nm, or greater than or equal to about 90 nm.

For example, either one of the first wavelength or the second wavelength may belong to a wavelength region of greater than or equal to about 750 nm and less than 1000 nm, and the other one of the first wavelength or the second wavelength may belong to a wavelength region of about 1000 nm to about 3000 nm.

For example, the plurality of sensors may include one infrared sensor and one image sensor. For example, the plurality of sensors may have a stacked structure of the aforementioned infrared sensor and an image sensor configured to sense light in a red wavelength region, a green wavelength region, a blue wavelength region, or any combination thereof.

Referring to FIG. 7, a sensor 300 according to some example embodiments includes an upper sensor 200, the insulation layer 80, the infrared sensor 100, and the semiconductor substrate 40. The upper sensor 200 and the infrared sensor 100 may be stacked.

The upper sensor 200 may be an infrared sensor or an image sensor.

The upper sensor 200 may be a photoelectric conversion device, and may include a lower electrode 210, an upper electrode 220, a light absorbing layer 230, and buffer layers 240 and 250. Either one of the lower electrode 210 or the upper electrode 220 may be an anode, and the other one may be a cathode. The light absorbing layer 230 may be configured to absorb light in the infrared wavelength region or the visible ray wavelength region. The light in the visible ray wavelength region may be light of the red wavelength region, the green wavelength region, the blue wavelength region, or the combination thereof. Light of the infrared wavelength region absorbed in the light absorbing layer 230 of the upper sensor 200 may not be overlapped with light in the infrared wavelength region sensed in the infrared sensor 100. The buffer layers 240 and 250 may be a hole injection layer (HIL), a hole transport layer (HTL), an electron blocking layer (EBL), an electron injection layer (EIL), an electron transport layer (ETL), a hole blocking layer (HBL), an optical auxiliary layer, or any combination thereof.

The infrared sensor 100 is as described above.

The insulation layer 80 is formed between the upper sensor 200 and the infrared sensor 100. The insulation layer 80 has a trench 85 exposing the charge storage 55, and the trench 85 may be filled with a filler.

The semiconductor substrate 40 is as described above, and the charge storage 55 is electrically connected to the first electrode 110 of the infrared sensor 100 or the lower electrode 210 of the upper sensor 200.

The insulation layer 60 is formed between the infrared sensor 100 and the semiconductor substrate 40. The insulation layer 60 has a trench 65 exposing the charge storage 55, and the trench 65 may be filled with a filler.

Figure 8:
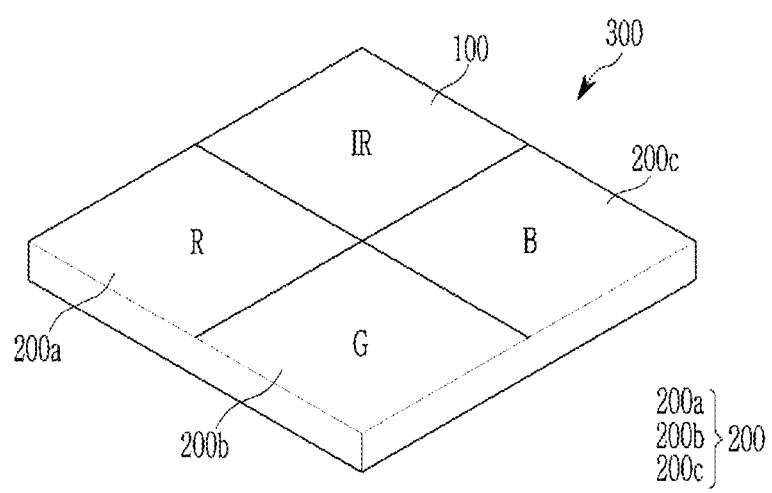
FIG. 8 is a perspective view schematically showing another example of a sensor according to some example embodiments.
Figure 9:
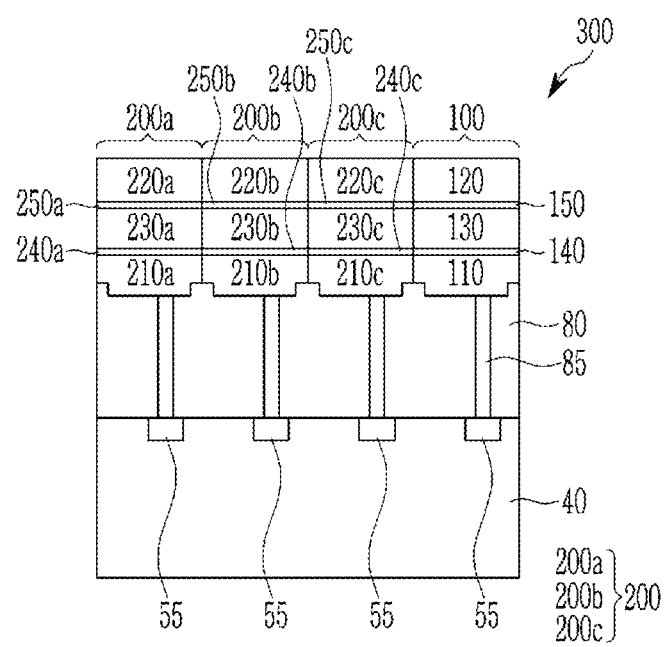
FIG. 9 is a cross-sectional view schematically showing an example of the sensor of FIG. 8, according to some example embodiments.

FIG. 8 is a perspective view schematically showing another example of a sensor according to some example embodiments and FIG. 9 is a cross-sectional view schematically showing an example of the sensor of FIG. 8.

Referring to FIGS. 8 and 9, the sensor 300 according to some example embodiments includes the semiconductor substrate 40, the infrared sensor 100, and the image sensor 200. The image sensor 200 includes a red sensor 200*a* configured to sense light in the red wavelength region, a green sensor 200*b* configured to sense light in the green wavelength region, and a blue sensor 200*c* configured to sense light in the blue wavelength region.

The infrared sensor 100, the red sensor 200a, the green sensor 200b, and the blue sensor 200c are arranged parallel to the surface of the semiconductor substrate 40 and respectively electrically connected to a charge storage 55 integrated in the semiconductor substrate 40. The infrared sensor 100, red sensor 200a, green sensor 200b and blue sensor 200c are individually photoelectric conversion devices.

The infrared sensor 100 is as described above.

The red sensor 200a includes a lower electrode 210a, a red light absorbing layer 230a, an upper electrode 220a, and buffer layers 240a and 250a. The green sensor 200b includes a lower electrode 210b, a green light absorbing layer 230b, an upper electrode 220b, and buffer layers 240b and 250b. The blue sensor 200c includes a lower electrode 210c, a blue light absorbing layer 230c, an upper electrode 220c and buffer layers 240c and 250c. The red light absorbing layer 230a may be configured to selectively absorb light in the red wavelength region and photoelectrically convert it, the green light absorbing layer 230b may be configured to selectively absorb light in the green wavelength region and photoelectrically convert it, and the blue light absorbing layer 230c may be configured to selectively absorb light in the blue wavelength region and photoelectrically convert it. The lower electrodes 210a, 210b, and 210c and the upper electrodes 220a, 220b, and 220c may be individually light-transmitting electrodes. The red light absorbing layer 230a, the green light absorbing layer 230b, and the blue light absorbing layer 230c may independently include an inorganic light absorbing material, an organic light absorbing material, an organic-inorganic light absorbing material, or any combination thereof, and for example, at least one of the red light absorbing layer 230a, the green light absorbing layer 230b, or the blue light absorbing layer 230c may include the organic light absorbing material. At least one of buffer layers 240a, 240b, 240c, 250a, 250b, or 250c may be omitted.

Figure 10:
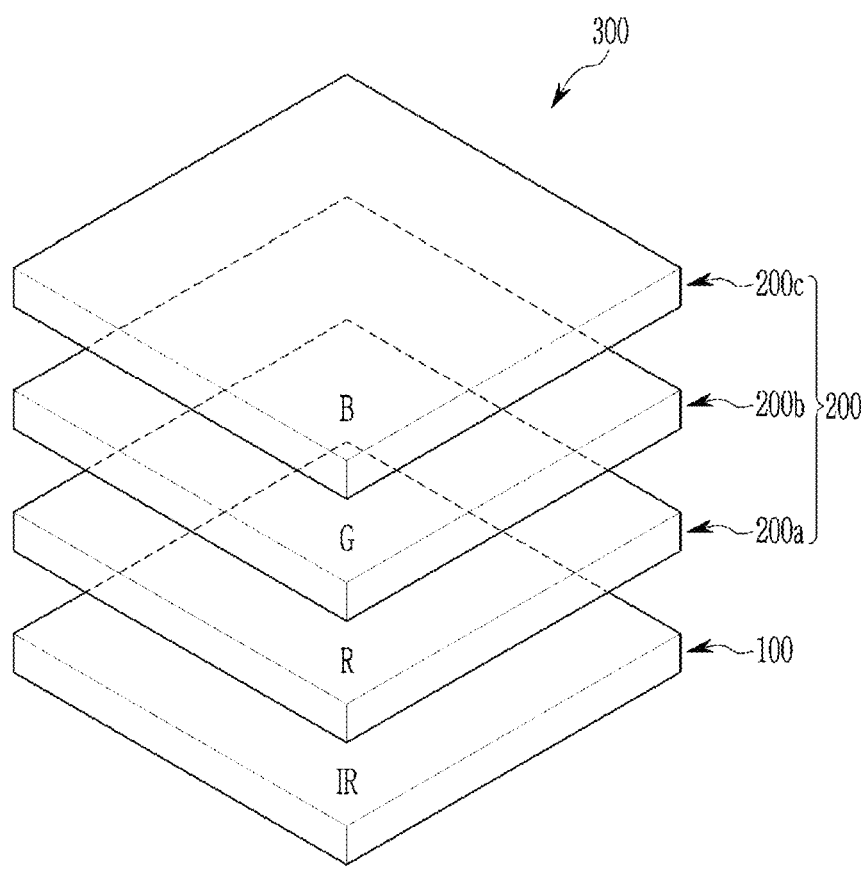
FIG. 10 is a perspective view schematically showing another example of a sensor according to some example embodiments.
Figure 11:
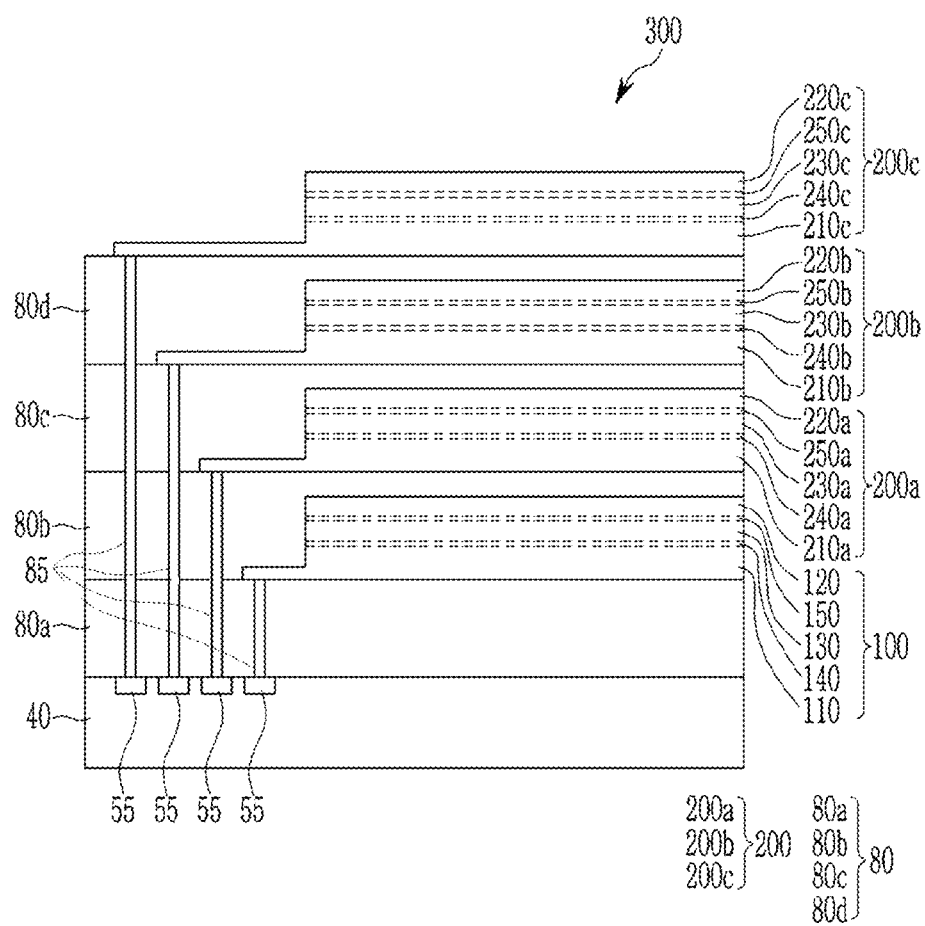
FIG. 11 is a cross-sectional view schematically showing an example of the sensor of FIG. 10.

FIG. 10 is a perspective view schematically showing another example of a sensor according to some example embodiments and FIG. 11 is a cross-sectional view schematically showing an example of the sensor of FIG. 10.

Referring to FIGS. 10 and 11, the sensor 300 according to some example embodiments includes a semiconductor substrate 40, an infrared sensor 100, an image sensor 200, and an insulation layer 80.

The image sensor 200 includes the red sensor 200a configured to sense light in the red wavelength region, the green sensor 200b configured to sense light in the green wavelength region, and the blue sensor 200c configured to sense light in the blue wavelength region.

The infrared sensor 100 and the image sensor 200 are stacked along the thickness direction of the semiconductor substrate 40. For example, the infrared sensor 100 is disposed below, and the image sensor 200 is disposed on the upper portion thereof. In the drawing, the structure of sequentially staking the red sensor 200a, the green sensor 200b, and the blue sensor 200c are shown as an example according to some example embodiments, but the red sensor 200a, the green sensor 200b, and the blue sensor 200c may be variously stacked.

The infrared sensor 100, the red sensor 200a, the green sensor 200b, and the blue sensor 200c are as described above.

The infrared sensor 100, the red sensor 200a, the green sensor 200b, and the blue sensor 200c are each electrically connected to the charge storages 55 integrated in the semiconductor substrate 40. Between the semiconductor substrate 40 and the infrared sensor 100 and between the infrared sensor 100 and the image sensor 200, each insulation layer 80a, 80b, 80c, and 80d is disposed.

The aforementioned sensors may be applied to various electronic devices, for example, mobile phones, digital cameras, biometric devices, security devices, and/or automobile electronic components, but is not limited thereto.

Figure 12:
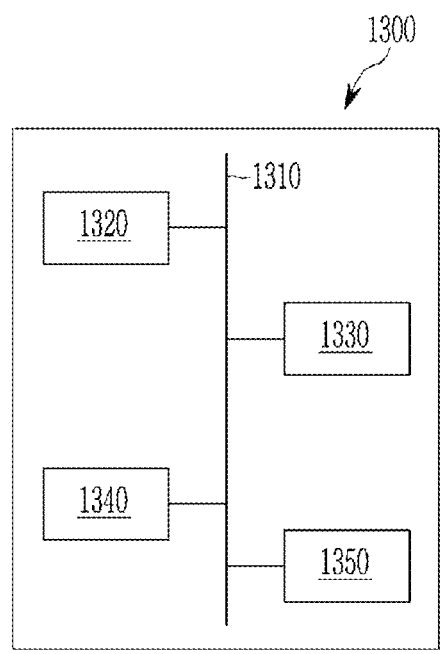
FIG. 12 is a schematic diagram of an electronic device according to some example embodiments.

FIG. 12 is a schematic diagram of an electronic device according to an example.

Referring to FIG. 12, an electronic device 1300 includes a processor 1320, a memory 1330, a sensor 1340, and a display device 1350 (e.g., a light emitting diode (LED) display panel device, an organic LED (OLED) display panel device, or the like) electrically connected through a bus 1310. The sensor 1340 may be the aforementioned sensor 300. The sensor 1340 may be any sensor, infrared sensor, or the like according to any of the example embodiments (e.g., infrared sensor 100, image sensor 200, and/or sensor 300). The processor 1320 may perform a memory program and thus at least one function. The processor 1320 may additionally perform a memory program and thus display an image on the display device 1350. The processor 1320 may generate an output.

The memory 1330 may be a non-transitory computer readable medium and may store a program of instructions. The memory 1330 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1320 may execute the stored program of instructions to perform one or more functions. For example, the processor 1320 may be configured to process electrical signals generated by the sensor 1340. The processor 1320 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 1320 may be configured to generate an output (e.g., an image to be displayed on the display device 1350) based on such processing.

Hereinafter, some example embodiments are illustrated in more detail with reference to examples. However, the present scope of the inventive concepts is not limited to the examples.

EXAMPLE: PRODUCTION OF INFRARED SENSOR

Examples 1 to 17

A triphenylamine derivative is deposited on an Ag reflective plate to form a lower buffer layer. Subsequently, on the lower buffer layer, Sn naphthaloxyanine (a near-infrared absorbing material (A), a p-type semiconductor) and C60 (a counter material (B), an n-type semiconductor) are co-deposited in a thickness ratio (a volume ratio) shown in Table 1 to form a light absorbing layer. Then, on the light absorbing layer, C60 is deposited to form an upper buffer layer, and silver (Ag) is deposited to be 30 nm thick on the upper buffer layer to form a 30 nm-thick upper electrode.

Subsequently, on the upper electrode, aluminum oxide ($Al_2O_3$) is deposited to be 100 nm, and sequentially, silicon oxynitride (SiON) is deposited to be 200 nm thick to manufacture an infrared sensor.

Thicknesses of the lower buffer layer, the light absorbing layer, and the upper buffer layer and a composition ratio (a thickness ratio or a volume ratio) in the light absorbing layer are shown in Table 1.

TABLE 1

| | Thickness (nm) | | | | Composition |
| --- | --- | --- | --- | --- | --- |
| | Lower Buffer Layer | Light Absorbing Layer | Upper buffer layer | Total Thickness | ratio of Light Absorbing Layer (A:B) |
| Example 1 | 10 | 200 | 30 | 240 | 60:140 |
| Example 2 | 20 | 200 | 30 | 250 | 60:140 |
| Example 3 | 20 | 200 | 30 | 250 | 100:100 |
| Example 4 | 10 | 210 | 50 | 270 | 60:150 |
| Example 5 | 20 | 210 | 50 | 280 | 60:150 |
| Example 6 | 30 | 210 | 50 | 290 | 60:150 |
| Example 7 | 10 | 210 | 45 | 265 | 60:150 |
| Example 8 | 10 | 210 | 50 | 270 | 60:150 |
| Example 9 | 10 | 210 | 70 | 290 | 60:150 |
| Example 10 | 20 | 190 | 30 | 240 | 50:140 |
| Example 11 | 20 | 200 | 30 | 250 | 60:140 |
| Example 12 | 20 | 215 | 30 | 265 | 75:140 |
| Example 13 | 20 | 260 | 30 | 310 | 120:140 |
| Example 14 | 100 | 360 | 100 | 560 | 110:250 |
| Example 15 | 100 | 360 | 150 | 610 | 110:250 |
| Example 16 | 100 | 130 | 80 | 310 | 40:90 |
| Example 17 | 100 | 100 | 120 | 320 | 30:70 |

\* Examples 2 and 11 are the same/Examples 4 and 8 are the same.

Examples 18 to 20

Infrared sensors are manufactured according to the same method as Example 1 except that ITO is sputtered to form a 7 nm-thick upper electrode instead of depositing silver (Ag), and then, aluminum oxide ($Al_2O_3$) and silicon oxynitride (SiON) are sequentially deposited thereon to have thicknesses shown in Table 2.

TABLE 2

| | Thickness of Optical Auxiliary Layer (nm) | |
| --- | --- | --- |
| | Aluminum Oxide ($Al_2O_3$) | Silicon Oxynitride (SiON) |
| Example 18 | 100 | 200 |
| Example 19 | 100 | 350 |
| Example 20 | 100 | 400 |

Comparative Example 1

On a glass substrate, ITO is sputtered to form a 150 nm-thick lower electrode. Subsequently, on the ITO electrode, a triphenylamine derivative is deposited to form a 10 nm-thick lower buffer layer. On the lower buffer layer, Sn-naphthaloxyanine (a near-infrared absorbing material (A), a p-type semiconductor) and C60 (a counter material (B), an n-type semiconductor) are co-deposited in a thickness ratio (or a volume ratio) of 80:250 to form a 330 nm-thick light absorbing layer. On the light absorbing layer, C60 is deposited to form a 30 nm-thick upper buffer layer, and ITO is sputtered thereon to form a 7 nm-thick upper electrode. On the upper electrode, aluminum oxide ($Al_2O_3$) is deposited to be 100 nm thick, and sequentially, silicon oxynitride (SiON) is deposited to be 200 nm thick to produce an infrared sensor.

Comparative Example 2

An infrared sensor is manufactured according to the same method as Example 1 except that silicon naphthalocyanine (Si-naphthalocyanine) is used instead of the Sn naphthaloxyanine.

Evaluation I

Optical spectra in an infrared wavelength region of the infrared sensors according to Examples and Comparative Examples are evaluated.

Figure 13:
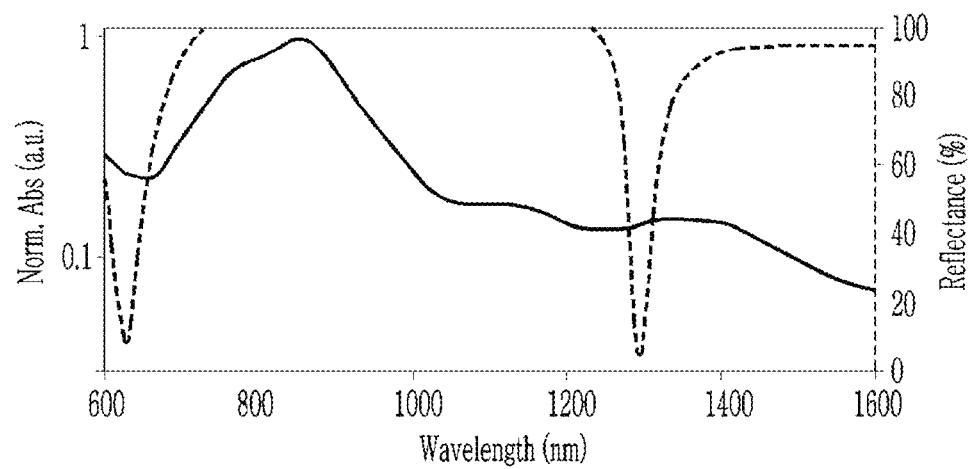
FIG. 13 is an optical spectrum of the infrared sensor according to Example 1, according to some example embodiments.
Figure 14:
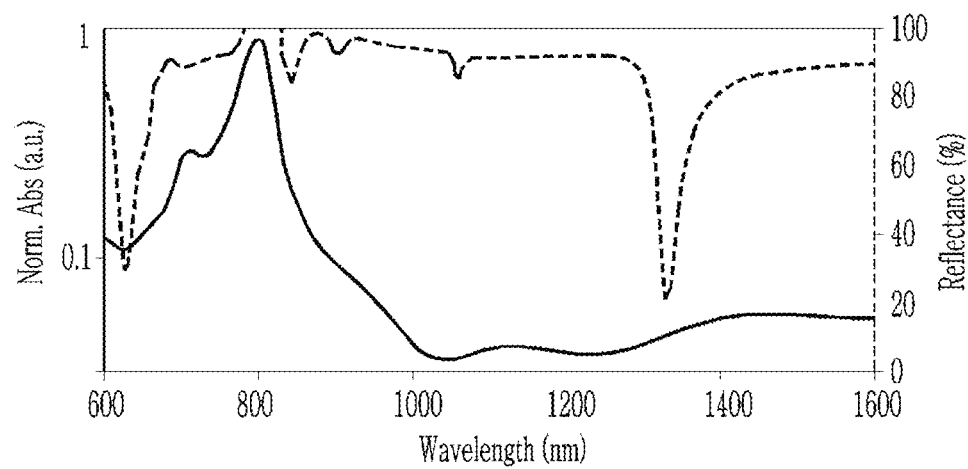
FIG. 14 is an optical spectrum of the infrared sensor according to Comparative Example 2, according to some example embodiments.
Figure 15:
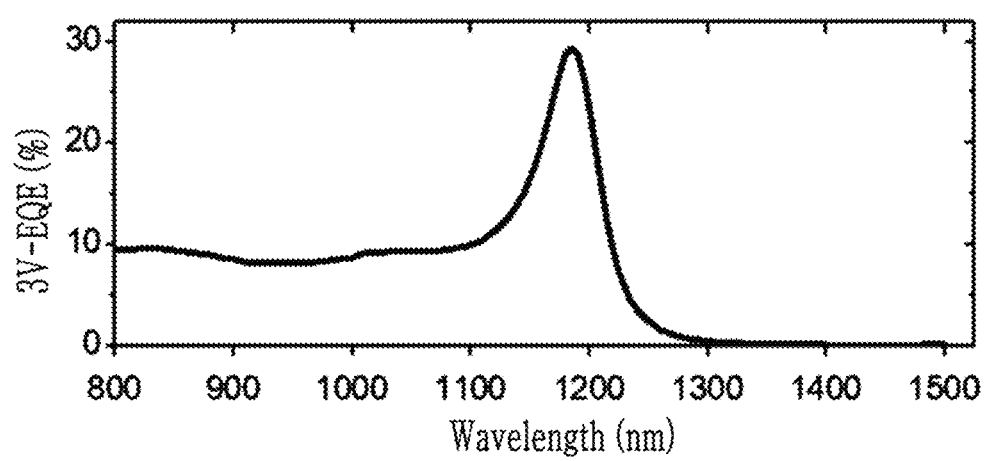
FIGS. 15, 16, 17, 18, 19, 20, 21, 22, 23, 24, 25, 26, 27, 28, 29, 30, and 31 are EQE spectra in the infrared wavelength region of the infrared sensors according to Examples 1 to 17, respectively, according to some example embodiments.
Figure 16:
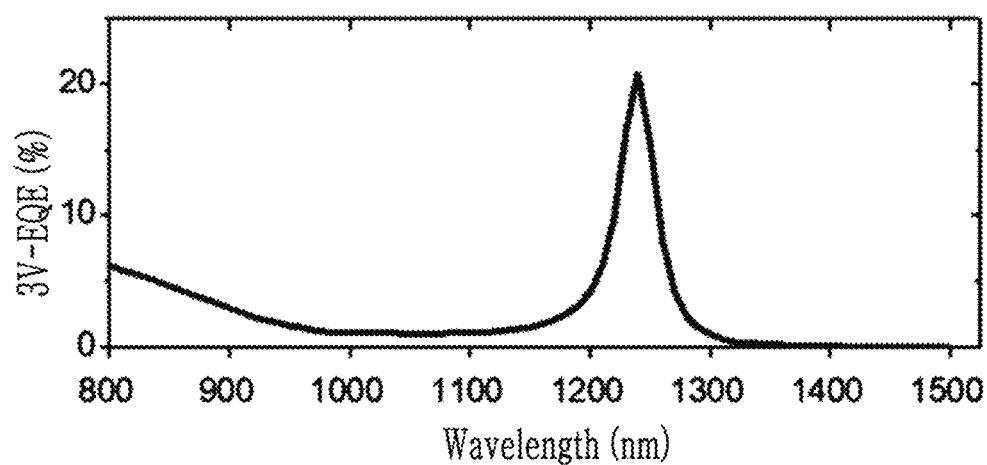
Figure 17:
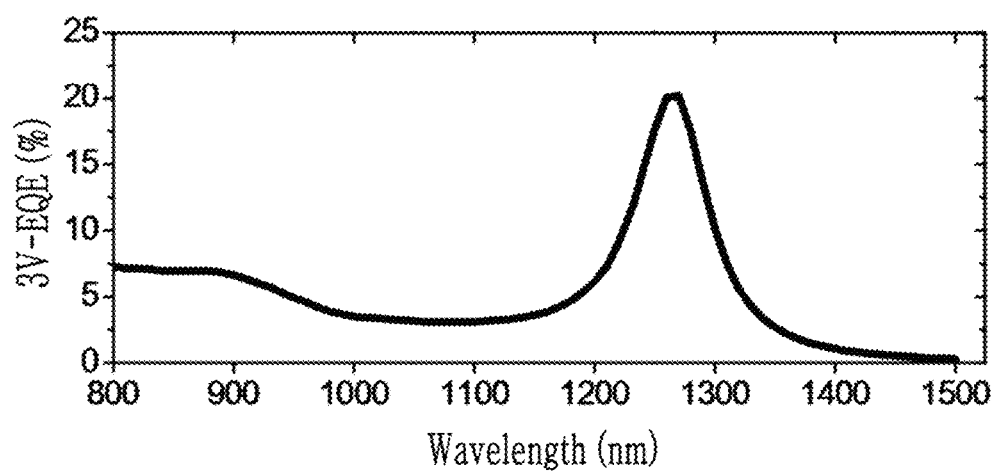
Figure 18:
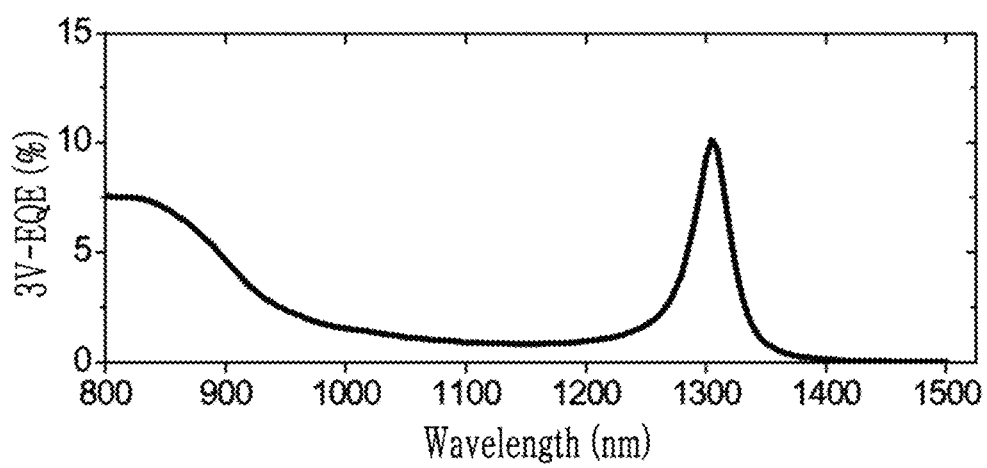
Figure 19:
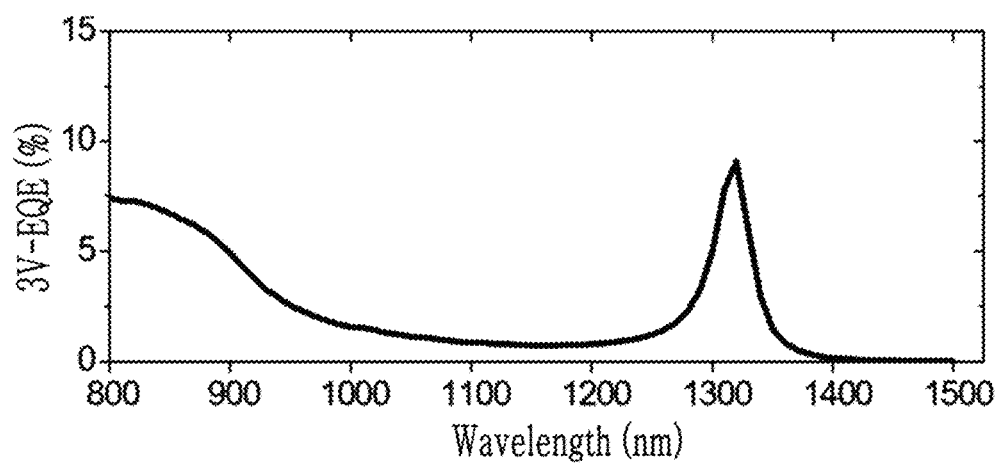
Figure 20:
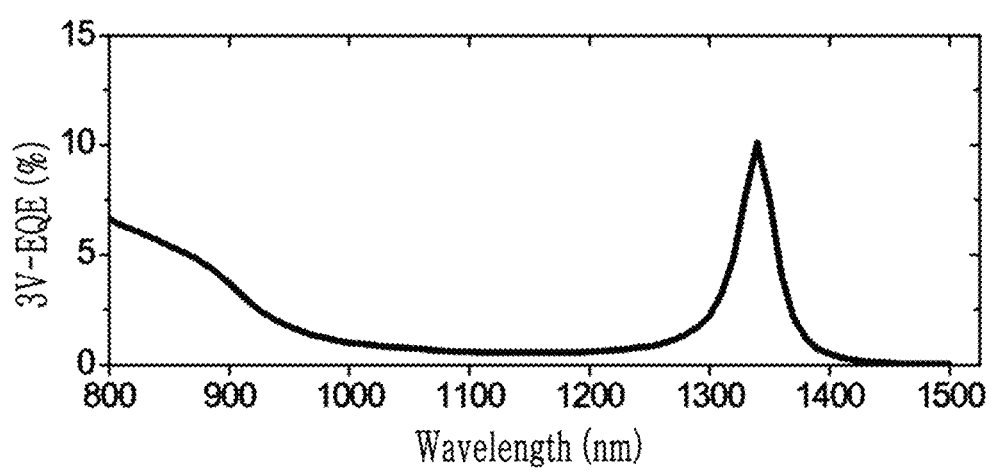
Figure 21:
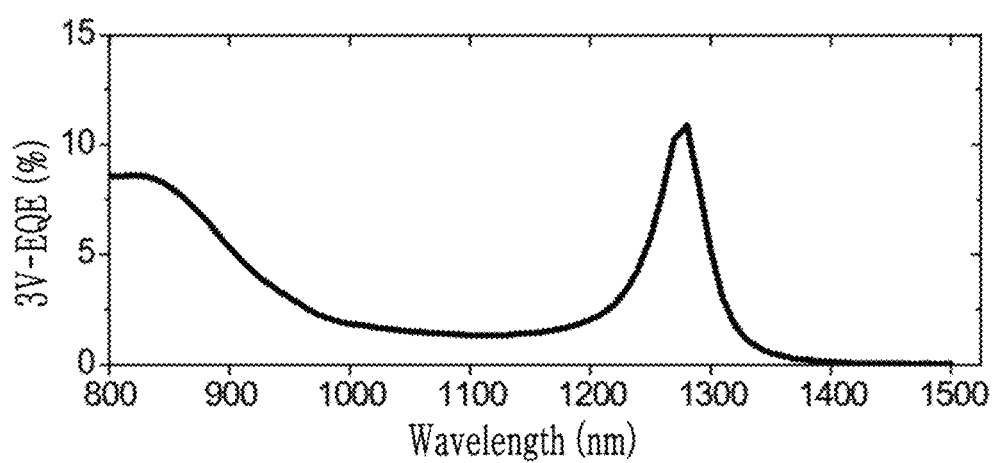
Figure 22:
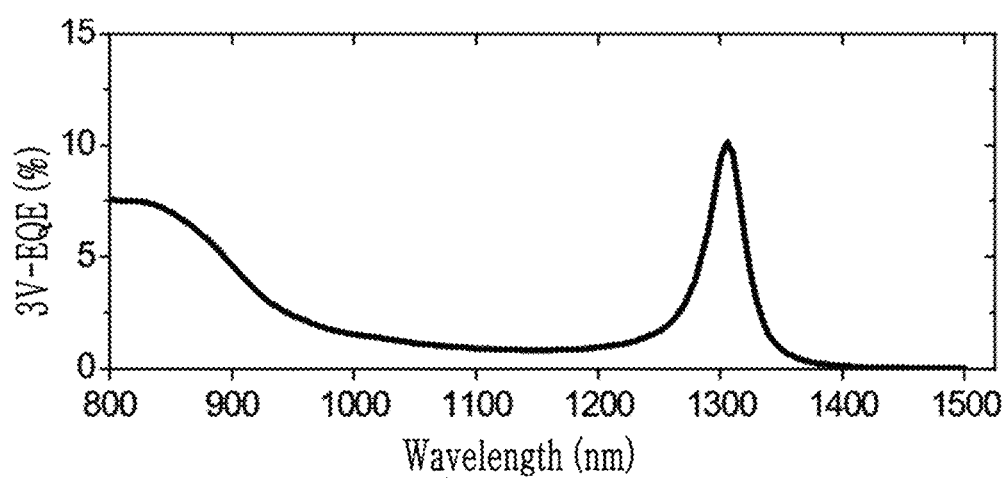
Figure 23:
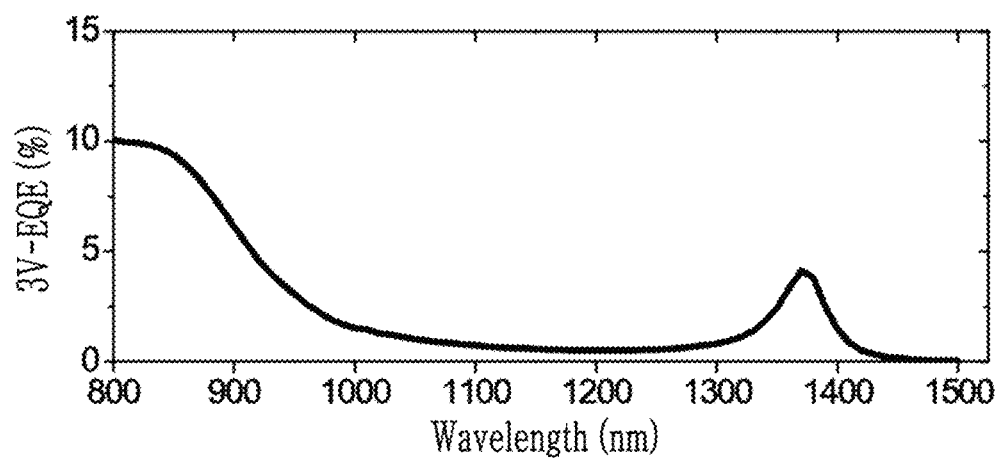
Figure 24:
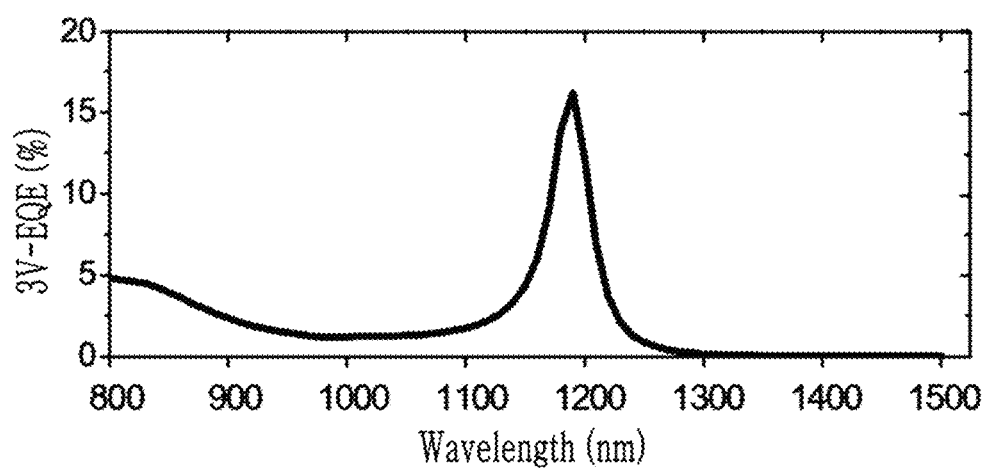
Figure 25:
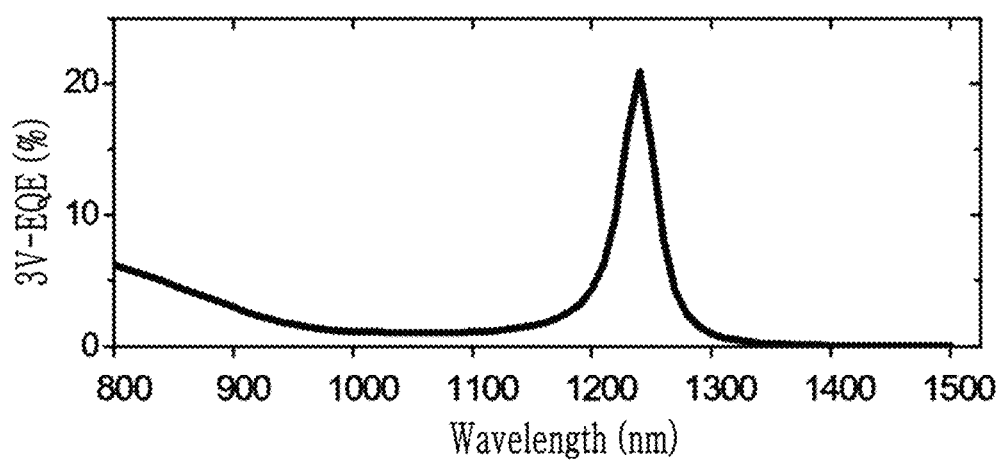
Figure 26:
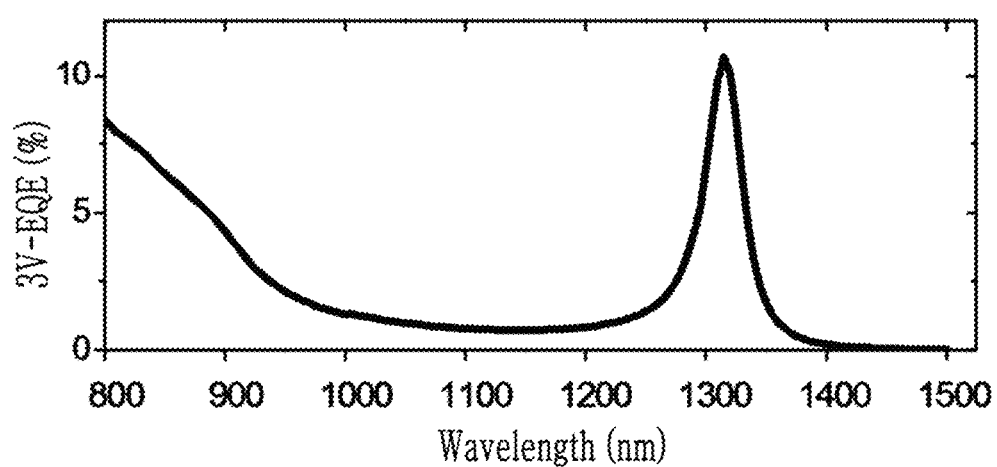
Figure 27:
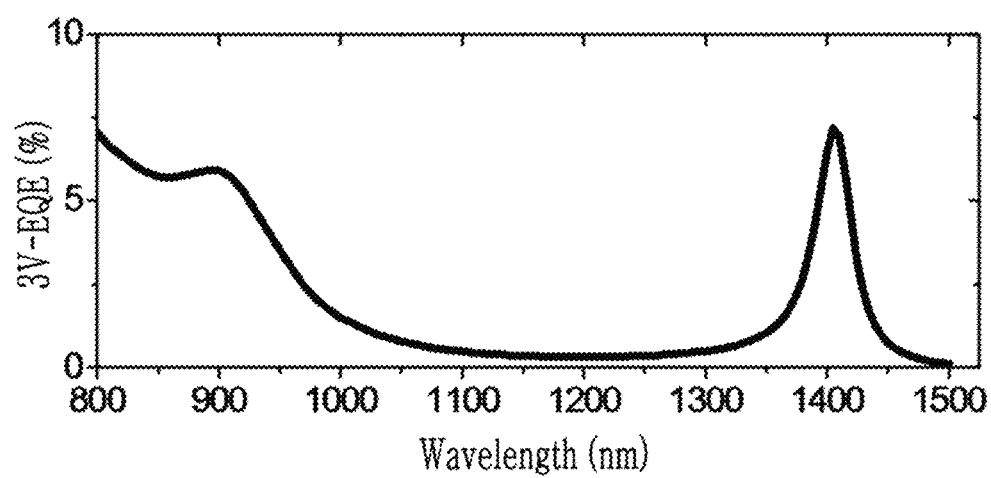
Figure 28:
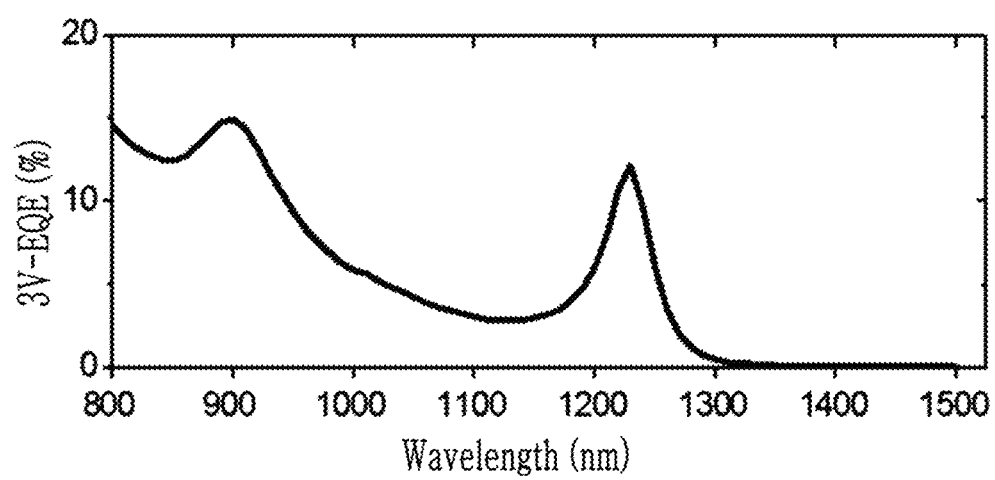
Figure 29:
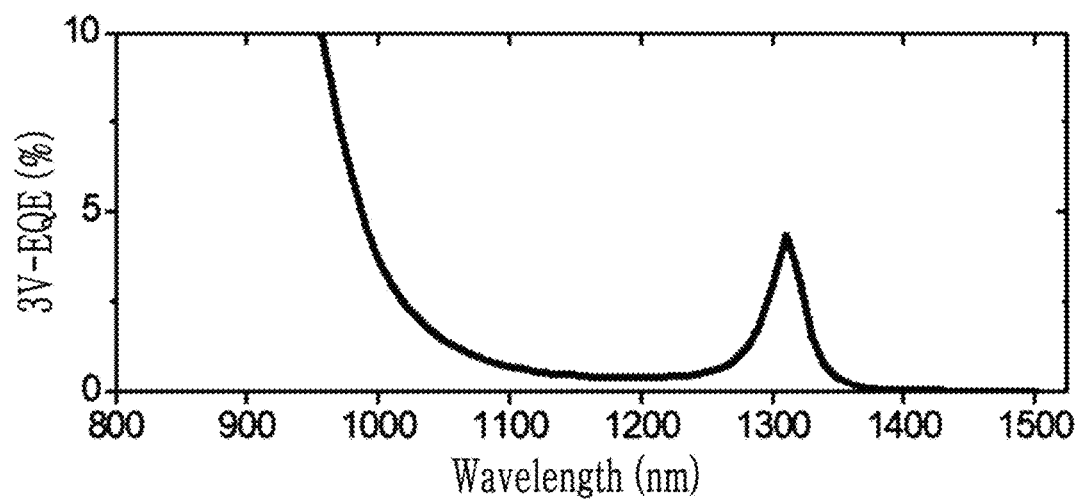
Figure 30:
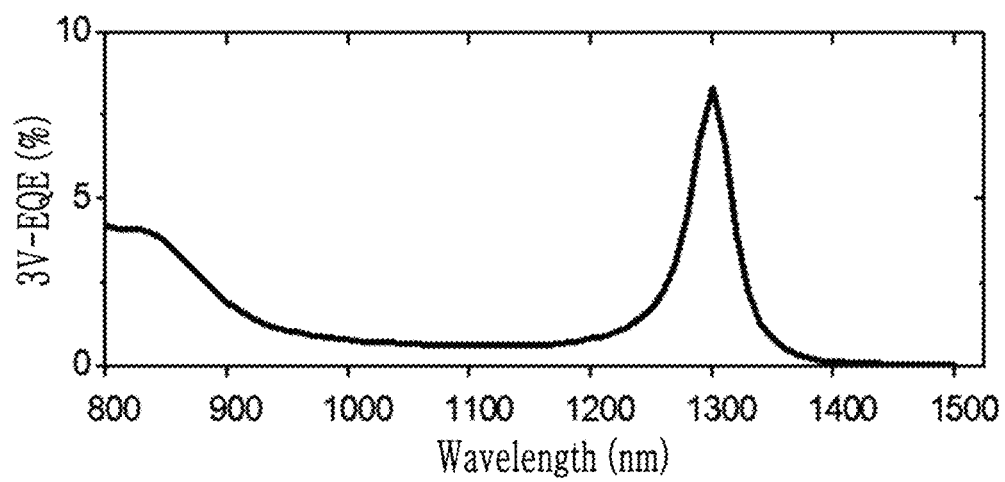
Figure 31:
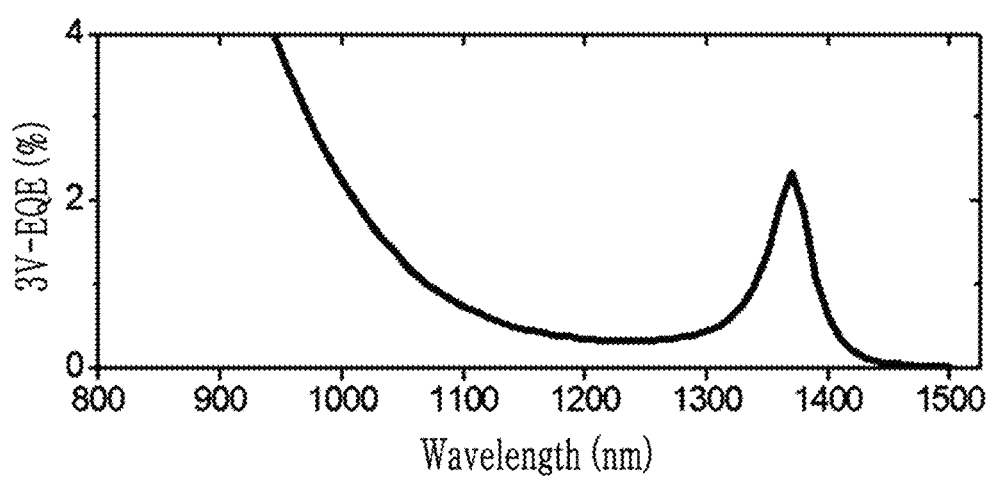

FIG. 13 is an optical spectrum of the infrared sensor according to Example 1 and FIG. 14 is an optical spectrum of the infrared sensor according to Comparative Example 2.

Referring to FIG. 13, the absorption spectrum of the infrared sensor according to Example 1 includes a main absorption spectrum having a maximum absorption wavelength ($\lambda_{max}$) in a wavelength region of greater than about 700 nm and less than about 1000 nm and a sub-absorption spectrum having particular (or, alternatively, predetermined) absorption intensity ($Abs_2/Abs_1 \geq 0.1$) in a wavelength region of greater than or equal to about 1100 nm (e.g., about 1100 nm to about 2000 nm).

On the contrary, referring to FIG. 14, the absorption spectrum of the infrared sensor according to Comparative Example 2 includes a main absorption spectrum having a maximum absorption wavelength ($\lambda_{max}$) in a wavelength region of greater than about 700 nm and less than about 1000 nm but no sub-absorption spectrum having particular (or, alternatively, predetermined) absorption intensity ($Abs_2/Abs_1 \geq 0.1$) in a wavelength region of greater than or equal to about 1100 nm.

Evaluation II

Photoelectric conversion efficiency and detection selectivity of the infrared sensors according to Examples and Comparative Examples are evaluated.

The photoelectric conversion efficiency is evaluated from an EQE maximum value ($EQE_{max}$) (also referred to herein interchangeably as a maximum EQE value) in an EQE spectrum and in detail, is evaluated by an IPCE (Incident Photon to Current Efficiency) method in a wavelength region of 800 nm to 1500 nm at 3 V.

Detection selectivity of the sensors is evaluated from a full width at half maximum (FWHM) in the EQE spectrum shown in a wavelength region of greater than or equal to 1000 nm.

The results are shown in Table 3 and FIGS. 15 to 33.

Figure 32:
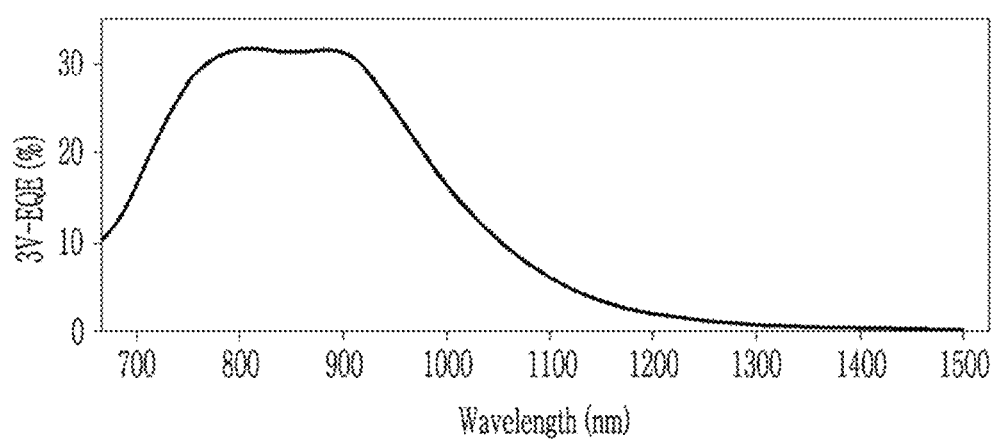
FIG. 32 is an EQE spectrum in the infrared wavelength region of the infrared sensor according to Comparative Example 1, according to some example embodiments.
Figure 33:
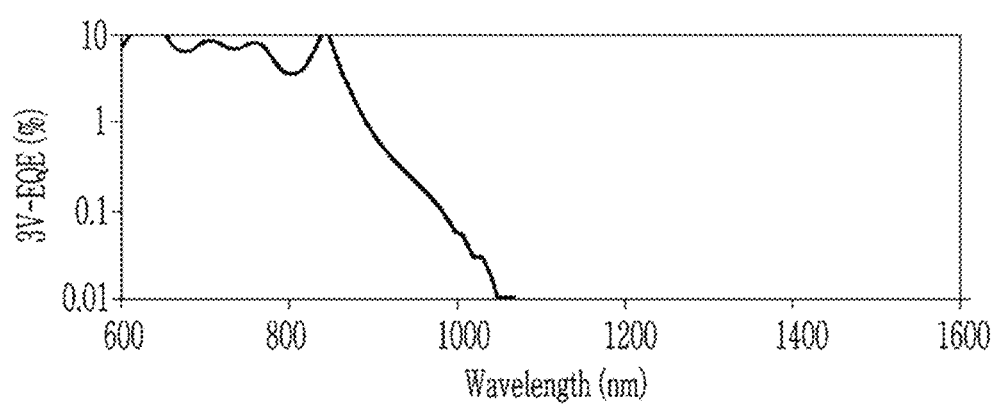
FIG. 33 is an EQE spectrum of the infrared wavelength region of the infrared sensor according to Comparative Example 2, according to some example embodiments.

FIGS. 15 to 31 are EQE spectra in the infrared wavelength region of the infrared sensors according to Examples 1 to 17, respectively, FIG. 32 is an EQE spectrum in the infrared wavelength region of the infrared sensor according to Comparative Example 1, and FIG. 33 is an EQE spectrum of the infrared wavelength region of the infrared sensor according to Comparative Example 2.

TABLE 3

| | $\lambda_{peak, EQE}$ (nm) | $EQE_{max}$ (%) | FWHM (nm) |
| --- | --- | --- | --- |
| Example 1 | 1190 | 29 | 70 |
| Example 2 | 1240 | 21 | 35 |
| Example 3 | 1270 | 20 | 76 |
| Example 4 | 1305 | 10 | 37 |
| Example 5 | 1320 | 9 | 36 |

TABLE 3-continued

| | $\lambda_{peak, EQE}$ (nm) | $EQE_{max}$ (%) | FWHM (nm) |
|---|---|---|---|
| Example 6 | 1340 | 10 | 37 |
| Example 7 | 1280 | 11 | 50 |
| Example 8 | 1305 | 10 | 37 |
| Example 9 | 1370 | 4 | 53 |
| Example 10 | 1190 | 16 | 40 |
| Example 11 | 1240 | 21 | 34 |
| Example 12 | 1315 | 11 | 32 |
| Example 13 | 1405 | 7 | 37 |
| Example 14 | 1230 | 12 | 50 |
| Example 15 | 1310 | 4.4 | 32 |
| Example 16 | 1300 | 8.3 | 39 |
| Example 17 | 1370 | 2.3 | 45 |
| Example 18 | 1010 | 43 | >100, <300 |
| Example 19 | 1100 | 20 | >100, <300 |
| Example 20 | 1200 | 5 | >100, <300 |
| Comparative Example 1 | 900 | 30 | >300 |
| Comparative Example 2 | 1290 | 0.05 | 40 |

Referring to Table 3 and FIGS. 15 to 33, the infrared sensors according to Examples, unlike the infrared sensors according to Comparative Examples, exhibit amplified EQE spectra in a wavelength region of greater than about 1000 nm (e.g., about 1000 nm to about 2000 nm, about 1000 nm to about 1600 nm, etc.).

In addition, when the EQE spectra of the infrared sensors according to Examples 1, 2, and 4 to 6 are compared, peak wavelengths of the EQE spectra are shifted depending on the thicknesses of the lower buffer layers, and specifically, as the thicknesses of the lower buffer layers are greater, the peak wavelengths of the EQE spectra are shifted toward a longer wavelength region.

In addition, comparing the EQE spectra of the infrared sensors according to Examples 7 to 9, 14, and 15, peak wavelengths of the EQE spectra are shifted depending on thicknesses of the upper buffer layers, and specifically, as the thicknesses of the upper buffer layers are greater, the peak wavelengths of the EQE spectra are shifted toward the longer wavelength region.

In addition, comparing the EQE spectra of the infrared sensors according to Examples 10 to 13, the peak wavelengths of the EQE spectra are shifted depending on the thicknesses of the light absorbing layers, and specifically, as the thicknesses of the light absorbing layer are greater, the peak wavelengths of the EQE spectra are shifted toward the longer wavelength region.

In addition, comparing the EQE spectra of the infrared sensors according to Examples 2 and 3, peak wavelengths of the EQE spectra are shifted according to composition ratios of the light absorbing layers, and specifically, as the composition ratio of the near-infrared absorbing material of the light absorbing layers is higher, the peak wavelengths of the EQE spectra are shifted toward the longer wavelength region.

In addition, comparing the EQE spectra of the infrared sensors according to Examples 18 to 20, peak wavelengths of the EQE spectra are shifted according to thickness ratios of the optical auxiliary layers, and specifically, as thickness ratios of the high refractive index layers and the low refractive index layers are larger, the peak wavelengths of the EQE spectra are shifted toward the longer wavelength region.

While this disclosure has been described in connection with what is presently considered to be practical example embodiments, it is to be understood that the inventive concepts are not limited to the disclosed example embodiments, but, on the contrary, is intended to cover various modifications and equivalent arrangements included within the spirit and scope of the appended claims.

What is claimed is:

1. A sensor, comprising:
   a first electrode, the first electrode including a reflective layer;
   a second electrode, the second electrode facing the first electrode; and
   a light absorbing layer between the first electrode and the second electrode,
   wherein the light absorbing layer includes a near-infrared absorbing material and a counter material defining a pn junction with the near-infrared absorbing material,
   wherein the near-infrared absorbing material is configured to absorb light in both a first absorption spectrum having a first absorption peak in a first infrared wavelength region and a second absorption spectrum having a second absorption peak in a second infrared wavelength region, wherein the second absorption spectrum does not at least partially overlap with the first absorption spectrum, wherein the second infrared wavelength region is a region having a longer wavelength than that of the first infrared wavelength region,
   wherein the second absorption spectrum has a lower absorption intensity than the first absorption spectrum, and
   wherein an external quantum efficiency (EQE) spectrum in the second infrared wavelength region is amplified.

2. The sensor of claim 1, wherein
   a variance of a local maximum EQE value ($EQE_{max}$) of the EQE spectrum from a remainder of EQE values of the EQE spectrum in the second infrared wavelength region is greater than a variance of the second absorption peak from a remainder of absorption intensities of the second absorption spectrum in the second infrared wavelength region, and/or
   a full width at half maximum (FWHM) of the EQE spectrum in the second infrared wavelength region is narrower than a full width at half maximum (FWHM) of the second absorption spectrum in the second infrared wavelength region.

3. The sensor of claim 1, wherein a difference between a wavelength at the second absorption peak of the second absorption spectrum and a wavelength at the first absorption peak of the first absorption spectrum is greater than or equal to about 100 nm.

4. The sensor of claim 3, wherein
   the wavelength at the first absorption peak of the first absorption spectrum is within with a range of about 700 nm to about 1000 nm, and
   the wavelength at the second absorption peak of the second absorption spectrum is within a separate range between about 1000 nm to about 3000 nm.

5. The sensor of claim 1, wherein a first absorption intensity at the first absorption peak of the first absorption spectrum and a second absorption intensity at the second absorption peak of the second absorption spectrum satisfy Relationship Equation 1:

[Relationship Equation 1]
   $0.1 \leq Abs_2/Abs_1 \leq 0.8$
   wherein, in Relationship Equation 1,
   $Abs_1$ is the first absorption intensity at the first absorption peak of the first absorption spectrum, and
   $Abs_2$ is the second absorption intensity at the second absorption peak of the second absorption spectrum.

6. The sensor of claim 1, wherein a full width at half maximum (FWHM) of the external quantum efficiency (EQE) spectrum in the second infrared wavelength region is narrower than a FWHM of the external quantum efficiency (EQE) spectrum in the first infrared wavelength region.

7. The sensor of claim 1, wherein a full width at half maximum (FWHM) of the external quantum efficiency (EQE) spectrum in the second infrared wavelength region is within a range of about 10 nm to about 200 nm.

8. The sensor of claim 1, wherein a maximum value of the external quantum efficiency ($EQE_{max}$) in the second infrared wavelength region is greater than or equal to about 4%.

9. The sensor of claim 1, further comprising:
a buffer layer between the first electrode and the light absorbing layer or between the second electrode and the light absorbing layer.

10. The sensor of claim 9, wherein
a peak wavelength of the EQE spectrum in the second infrared wavelength region is at least partially defined by a distance between the reflective layer and the second electrode, and
the distance between the reflective layer and the second electrode is at least partially defined by at least one of a thickness of the light absorbing layer or a thickness of the buffer layer.

11. The sensor of claim 10, wherein as the distance between the reflective layer and the second electrode increases, the peak wavelength of the EQE spectrum in the second infrared wavelength region is shifted to a longer wavelength region, such that a wavelength magnitude of the peak wavelength of the EQE spectrum in the second infrared wavelength region is proportional to the distance between the reflective layer and the second electrode.

12. The sensor of claim 10, wherein as the thickness of the light absorbing layer increases, the peak wavelength of the EQE spectrum in the second infrared wavelength region is shifted to a longer wavelength region, such that a wavelength magnitude of the peak wavelength of the EQE spectrum in the second infrared wavelength region is proportional to the thickness of the light absorbing layer.

13. The sensor of claim 10, wherein as the thickness of the buffer layer increases, the peak wavelength of the EQE spectrum in the second infrared wavelength region is shifted to a longer wavelength region, such that a wavelength magnitude of the peak wavelength of the EQE spectrum in the second infrared wavelength region is proportional to the thickness of the buffer layer.

14. The sensor of claim 1, wherein
a peak wavelength of the EQE spectrum in the second infrared wavelength region is at least partially defined by a composition ratio of the near-infrared absorbing material and the counter material in the light absorbing layer.

15. The sensor of claim 14, wherein as the composition ratio of the near-infrared absorbing material relative to the counter material is higher, the peak wavelength of the EQE spectrum in the second infrared wavelength region is shifted to a longer wavelength region, such that a magnitude of the peak wavelength of the EQE spectrum in the second infrared wavelength region is proportional to the composition ratio of the near-infrared absorbing material relative to the counter material.

16. The sensor of claim 1, wherein the reflective layer includes Ag, Cu, Al, Au, Ti, Cr, Ni, an alloy thereof, a nitride thereof, or any combination thereof.

17. The sensor of claim 1, wherein the second electrode includes a semi-transmissive layer.

18. The sensor of claim 17, wherein
the first electrode and the second electrode are configured to collectively define a microcavity in the sensor, and
a peak wavelength of the external quantum efficiency (EQE) spectrum in the second infrared wavelength region is at least partially defined by a resonance wavelength of the microcavity.

19. The sensor of claim 1, further comprising:
an optical auxiliary layer on the second electrode,
wherein the second electrode includes a light-transmitting layer, a semi-transmissive layer, or any combination thereof.

20. The sensor of claim 19, wherein the optical auxiliary layer includes a first optical auxiliary layer and a second optical auxiliary layer, the first optical auxiliary layer and the second optical auxiliary layer having different refractive indexes.

21. The sensor of claim 19, wherein
the first electrode and the second electrode, or the first electrode and the optical auxiliary layer, collectively define a microcavity, and
a peak wavelength of the EQE spectrum in the second infrared wavelength region is at least partially defined by a resonance wavelength of the microcavity.

22. The sensor of claim 1, wherein
the second electrode includes an inorganic nano-layer facing the light absorbing layer such that the inorganic nano-layer is proximate to the light absorbing layer in relation to a surface of the second electrode that is distal from the light absorbing layer, and
the inorganic nano-layer includes ytterbium (Yb), calcium (Ca), potassium (K), barium (Ba), magnesium (Mg), lithium fluoride (LiF), or an alloy thereof.

23. The sensor of claim 1, further comprising a semiconductor substrate, the semiconductor substrate being under the first electrode.

24. An electronic device comprising the sensor of claim 1.

25. A sensor, comprising:
a first electrode and a second electrode facing each other; and
a light absorbing layer between the first electrode and the second electrode,
wherein the light absorbing layer includes a near-infrared absorbing material and a counter material defining a pn junction with the near-infrared absorbing material,
wherein the near-infrared absorbing material is configured to absorb light in both a first absorption spectrum having a first absorption peak in a first infrared wavelength region and a second absorption spectrum having a second absorption peak in a second infrared wavelength region, wherein the second absorption spectrum does not at least partially overlap with the first absorption spectrum, wherein the second infrared wavelength region is a region having a longer wavelength than that of the first infrared wavelength region,
wherein the second absorption spectrum has a lower absorption intensity than the first absorption spectrum,
wherein a maximum absorption wavelength of an absorption spectrum of the sensor is within a range of about 800 nm to about 990 nm, and
wherein the sensor is configured to generate an electrical current based on photoelectrically converting incident light in a wavelength region of greater than or equal to about 1100 nm.

26. The sensor of claim 25, wherein
a peak wavelength of an external quantum efficiency (EQE) spectrum of the sensor is within a range of about 1100 nm to about 1800 nm, and
a full width at half maximum (FWHM) of the EQE spectrum of the sensor is within a range of about 10 nm to about 200 nm.

27. The sensor of claim 25, wherein a maximum value of an external quantum efficiency ($EQE_{max}$) in the wavelength region of greater than or equal to about 1100 nm of the sensor is greater than or equal to about 4%.

28. The sensor of claim 25, further comprising a buffer layer between the first electrode and the light absorbing layer or between the second electrode and the light absorbing layer.

29. The sensor of claim 28, wherein
the first electrode includes a reflective layer, and
a peak wavelength of an external quantum efficiency (EQE) spectrum of the sensor is at least partially defined by at least one of a thickness of the light absorbing layer or a thickness of the buffer layer.

30. The sensor of claim 25, further comprising a semiconductor substrate, the semiconductor substrate being under the first electrode.

31. An electronic device comprising the sensor of claim 25.

32. A sensor, comprising:
a first electrode and a second electrode facing each other; and
a light absorbing layer between the first electrode and the second electrode,
wherein the light absorbing layer includes a near-infrared absorbing material and a counter material defining a pn junction with the near-infrared absorbing material, wherein the near-infrared absorbing material is configured to absorb light in both a first absorption spectrum having a first absorption peak in a first infrared wavelength region and a second absorption spectrum having a second absorption peak in a second infrared wavelength region, wherein the second absorption spectrum does not at least partially overlap with the first absorption spectrum, wherein the second infrared wavelength region is a region having a longer wavelength than that of the first infrared wavelength region,
wherein the second absorption spectrum has a lower absorption intensity than the first absorption spectrum,
wherein a maximum absorption wavelength of the light absorbing layer is within a range of about 700 nm to about 1000 nm,
wherein an external quantum efficiency (EQE) spectrum of the sensor has a local maximum EQE value at a local peak wavelength that is greater than about 1000 nm, such that
EQE values of the EQE spectrum of the sensor at all wavelengths up to 100 nm shorter than the local peak wavelength are smaller than the local maximum EQE value, and
EQE values of the EQE spectrum of the sensor at all wavelengths up to 100 nm longer than the local peak wavelength are smaller than the local maximum EQE value.

33. The sensor of claim 32, wherein the local maximum EQE value of the EQE spectrum of the sensor is greater than or equal to about 4%.

34. The sensor of claim 32, further comprising a buffer layer between the first electrode and the light absorbing layer or between the second electrode and the light absorbing layer.

35. The sensor of claim 34, wherein
the first electrode includes a reflective layer, and
the local peak wavelength is at least partially defined by at least one of a thickness of the light absorbing layer or a thickness of the buffer layer.

36. The sensor of claim 32, further comprising:
an optical auxiliary layer on the second electrode,
wherein the second electrode includes a light-transmitting layer, a semi-transmissive layer, or any combination thereof.

37. The sensor of claim 36, wherein the optical auxiliary layer includes a first optical auxiliary layer and a second optical auxiliary layer, the first optical auxiliary layer and the second optical auxiliary layer having different refractive indexes.

38. The sensor of claim 36, wherein
the first electrode and the second electrode, or the first electrode and the optical auxiliary layer, collectively define a microcavity, and
the local peak wavelength is at least partially defined by a resonance wavelength of the microcavity.

39. An electronic device comprising the sensor of claim 32.

* * * * *